(12) United States Patent
Kiyosawa

(10) Patent No.: US 10,763,330 B2
(45) Date of Patent: Sep. 1, 2020

(54) SILICON CARBIDE SEMICONDUCTOR ELEMENT AND METHOD FOR MANUFACTURING SAME

(71) Applicant: Panasonic Intellectual Property Management Co., Ltd., Osaka (JP)

(72) Inventor: Tsutomu Kiyosawa, Toyama (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/254,881

(22) Filed: Jan. 23, 2019

(65) Prior Publication Data
US 2019/0245039 A1   Aug. 8, 2019

(30) Foreign Application Priority Data
Feb. 7, 2018 (JP) .................................. 2018-019808

(51) Int. Cl.
*H01L 29/10* (2006.01)
*H01L 29/16* (2006.01)
(Continued)

(52) U.S. Cl.
CPC ........ *H01L 29/105* (2013.01); *H01L 21/0257* (2013.01); *H01L 21/0262* (2013.01);
(Continued)

(58) Field of Classification Search
CPC ............ H01L 29/105; H01L 21/02378; H01L 21/02529; H01L 21/0257; H01L 21/0262;
(Continued)

(56) References Cited

U.S. PATENT DOCUMENTS

2006/0220026 A1* 10/2006 Uchida ................. H01L 21/049
257/77
2009/0008649 A1* 1/2009 Suzuki ................ H01L 29/0626
257/77
(Continued)

FOREIGN PATENT DOCUMENTS

WO   2010/125819   11/2010

*Primary Examiner* — Shahed Ahmed
(74) *Attorney, Agent, or Firm* — McDermott Will & Emery LLP

(57) ABSTRACT

A silicon carbide semiconductor element includes a silicon carbide semiconductor layer of a first conductivity type, a body region of a second conductivity type, a channel layer made of a silicon carbide semiconductor disposed on the silicon carbide semiconductor layer so as to be in contact with at least a part of the body region, and a gate electrode disposed on the channel layer via a gate insulating film. The channel layer has a multilayer structure of a high-concentration impurity layer containing impurities of the first conductivity type, a first medium-concentration impurity layer containing impurities of the first conductivity type, and a first low-concentration impurity layer containing impurities of the first conductivity type. The first low-concentration impurity layer is disposed closer to the body region than the high-concentration impurity layer and the first medium-concentration impurity layer.

14 Claims, 12 Drawing Sheets

(51) Int. Cl.
*H01L 29/06* (2006.01)
*H01L 29/08* (2006.01)
*H01L 29/36* (2006.01)
*H01L 21/02* (2006.01)
*H01L 29/66* (2006.01)
*H01L 29/78* (2006.01)
*H01L 29/417* (2006.01)
*H01L 29/739* (2006.01)

(52) U.S. Cl.
CPC .. *H01L 21/02378* (2013.01); *H01L 21/02529* (2013.01); *H01L 21/02634* (2013.01); *H01L 29/0696* (2013.01); *H01L 29/083* (2013.01); *H01L 29/0865* (2013.01); *H01L 29/1095* (2013.01); *H01L 29/1608* (2013.01); *H01L 29/36* (2013.01); *H01L 29/417* (2013.01); *H01L 29/41741* (2013.01); *H01L 29/66068* (2013.01); *H01L 29/7393* (2013.01); *H01L 29/7802* (2013.01)

(58) Field of Classification Search
CPC .......... H01L 21/02634; H01L 29/0696; H01L 29/083; H01L 29/0865; H01L 29/1095; H01L 29/1608; H01L 29/36; H01L 29/417; H01L 29/41741; H01L 29/66068; H01L 29/7393; H01L 29/7802; H01L 29/66325–66348; H01L 21/0445–0495; H01L 29/66053–66068
See application file for complete search history.

(56) References Cited

U.S. PATENT DOCUMENTS

| | | | |
|---|---|---|---|
| 2012/0057386 A1 | 3/2012 | Adachi et al. | |
| 2012/0139623 A1* | 6/2012 | Hashimoto | H01L 29/66068 327/537 |
| 2012/0305944 A1* | 12/2012 | Kitabatake | H01L 29/7828 257/77 |
| 2014/0183562 A1* | 7/2014 | Kiyosawa | H01L 29/66068 257/77 |
| 2014/0246682 A1* | 9/2014 | Uchida | H01L 27/0629 257/77 |
| 2015/0287818 A1* | 10/2015 | Yen | H01L 29/7828 257/77 |

* cited by examiner

SILICON CARBIDE SEMICONDUCTOR ELEMENT AND METHOD FOR MANUFACTURING SAME

BACKGROUND

1. Technical Field

The present disclosure relates to a silicon carbide semiconductor element and a method for manufacturing the same.

2. Description of the Related Art

A power semiconductor device is a semiconductor element for use in applications that require high breakdown voltage and a large amount of current. Such a power semiconductor device has been desired to reduce power loss. Heretofore, a power semiconductor device including a silicon (Si) substrate has been widely used. In recent years, attention has been given to a power semiconductor device including a silicon carbide (SiC) substrate, and such a power semiconductor device has been developed.

Silicon carbide (SiC) is higher in breakdown voltage by one digit than silicon (Si), and therefore a feature of silicon carbide is to maintain breakdown voltage even when a depletion layer is smaller in thickness at a pn junction or a Schottky contact. The use of silicon carbide enables a reduction in thickness of a device and an increase in doping concentration. Therefore, silicon carbide has been expected as a material for a power semiconductor device that requires low on-resistance, high breakdown voltage, and low power loss.

A typical one of semiconductor elements employing SiC is a metal-insulator-semiconductor field-effect transistor (MISFET). A metal-oxide-semiconductor field-effect transistor (MOSFET) is one kind of the MISFET.

A silicon carbide semiconductor element such as a MISFET made of SiC (hereinafter, such a MISFET will be referred to as a "SiC-MISFET") is formed by using a silicon carbide epitaxial layer formed on a main surface of a silicon carbide wafer. A plurality of silicon carbide semiconductor elements (chips) is normally produced from a single silicon carbide wafer. In each of the silicon carbide semiconductor elements, the silicon carbide epitaxial layer includes a drift layer. In addition, a silicon carbide layer serving as a channel layer may be formed on the silicon carbide epitaxial layer.

PTL 1 discloses an vertical SiC-MISFET including a channel layer.

CITATION LIST

Patent Literature

PTL 1: WO 2010/125819

SUMMARY

A silicon carbide semiconductor element such as a SiC-MISFET has been required to satisfy a demand for lower resistance (lower power loss) in some cases.

An aspect of the present disclosure provides a silicon carbide semiconductor element capable of reducing on-resistance.

One aspect of the present disclosure provides a silicon carbide semiconductor element including a plurality of unit cells. Each of the plurality of unit cells includes a substrate, a silicon carbide semiconductor layer, a body region, a source region, a channel layer, a gate insulating film, and a gate electrode. The substrate has a first main surface and a second main surface. The silicon carbide semiconductor layer is of a first conductivity type and is disposed on the first main surface of the substrate. The body region is of a second conductivity type and is in contact with a surface of the silicon carbide semiconductor layer. The source region is of the first conductivity type and is in contact with the body region. The channel layer is made of a silicon carbide semiconductor. The channel layer is disposed above the silicon carbide semiconductor layer so as to be in contact with at least a part of the body region. The gate insulating film is disposed above the channel layer. The gate electrode is disposed above the gate insulating film. The channel layer has a multilayer structure including a high-concentration impurity layer, a first medium-concentration impurity layer, and a first low-concentration impurity layer. The high-concentration impurity layer contains impurities of the first conductivity type in a concentration ranging from $1 \times 10^{18}/cm^3$ to $1 \times 10^{19}/cm^3$ inclusive. The first medium-concentration impurity layer contains impurities of the first conductivity type in a concentration ranging from more than or equal to $1 \times 10^{17}/cm^3$ to less than $1 \times 10^{18}/cm^3$. The first low-concentration impurity layer contains impurities of the first conductivity type in a concentration of less than $1 \times 10^{17}/cm^3$. The first low-concentration impurity layer is disposed closer to the body region than the high-concentration impurity layer and the first medium-concentration impurity layer.

Another aspect of the present disclosure provides a silicon carbide semiconductor element including a plurality of unit cells. Each of the plurality of unit cells includes a substrate, a silicon carbide semiconductor layer, a body region, a source region, a channel layer, a gate insulating film, and a gate electrode. The substrate has a first main surface and a second main surface. The silicon carbide semiconductor layer is of a first conductivity type and is disposed on the first main surface of the substrate. The body region is of a second conductivity type and is in contact with a surface of the silicon carbide semiconductor layer. The source region is of the first conductivity type and is in contact with the body region. The channel layer is made of a silicon carbide semiconductor. The channel layer is disposed above the silicon carbide semiconductor layer so as to be in contact with at least a part of the body region. The gate insulating film is disposed above the channel layer. The gate electrode is disposed above the gate insulating film. The channel layer has a multilayer structure including a first medium-concentration impurity layer, a second medium-concentration impurity layer, and a high-concentration impurity layer. Each of the first medium-concentration impurity layer and the second medium-concentration impurity layer contains an impurity of the first conductivity type in a concentration ranging from more than or equal to $1 \times 10^{17}/cm^3$ to less than $1 \times 10^{18}/cm^3$. The high-concentration impurity layer contains an impurity of the first conductivity type in a concentration ranging from $1 \times 10^{18}/cm^3$ to $1 \times 10^{19}/cm^3$ inclusive. The high-concentration impurity layer is disposed between the first medium-concentration impurity layer and the second medium-concentration impurity layer.

Still another aspect of the present disclosure provides a method for manufacturing a silicon carbide semiconductor element. The method for manufacturing the silicon carbide semiconductor element includes a process of preparing a substrate and a process of forming a channel layer.

In the process of preparing the substrate, the substrate has a first main surface and a second main surface. The substrate also has a silicon carbide semiconductor layer of a first conductivity type disposed on the first main surface, a body region of a second conductivity type that is in contact with a surface of the silicon carbide semiconductor layer, and a source region of the first conductivity type that is in contact with the body region.

In the process of forming the channel layer, a source gas and an impurity gas containing impurities of the first conductivity type are supplied onto the surface of the silicon carbide semiconductor layer to allow a silicon carbide semiconductor to epitaxially grow in a chamber. The channel layer is formed above the silicon carbide semiconductor layer so as to bring the channel layer into contact with at least a part of the body region. Further, in the process of forming the channel layer, a channel layer having a multi-layer structure of a plurality of layers different in impurity concentrations of the first conductivity type is formed by varying a supply amount of the impurity gas. The plurality of layers includes a high-concentration impurity layer containing impurities of the first conductivity type in a concentration ranging from $1 \times 10^{18}/cm^3$ to $1 \times 10^{19}/cm^3$ inclusive, a medium-concentration impurity layer containing impurities of the first conductivity type in a concentration ranging from more than or equal to $1 \times 10^{17}/cm^3$ to less than $1 \times 10^{18}/cm^3$, and a low-concentration impurity layer containing impurities of the first conductivity type in a concentration of less than $1 \times 10^{17}/cm^3$. The low-concentration impurity layer is disposed closer to the body region than the high-concentration impurity layer and the medium-concentration impurity layer. The chamber has a plurality of impurity gas passages for supplying the impurity gas into the chamber. A flow rate of the impurity gas flowing in each of the plurality of impurity gas passages can be controlled independently of each other. At least the high-concentration impurity layer and the medium-concentration impurity layer are formed by supplying the impurity gas, using mutually different impurity gas passages out of the plurality of impurity gas passages.

According to the present disclosure, a silicon carbide semiconductor element capable of reducing on-resistance can be provided.

DETAILED DESCRIPTION

Figure 1:
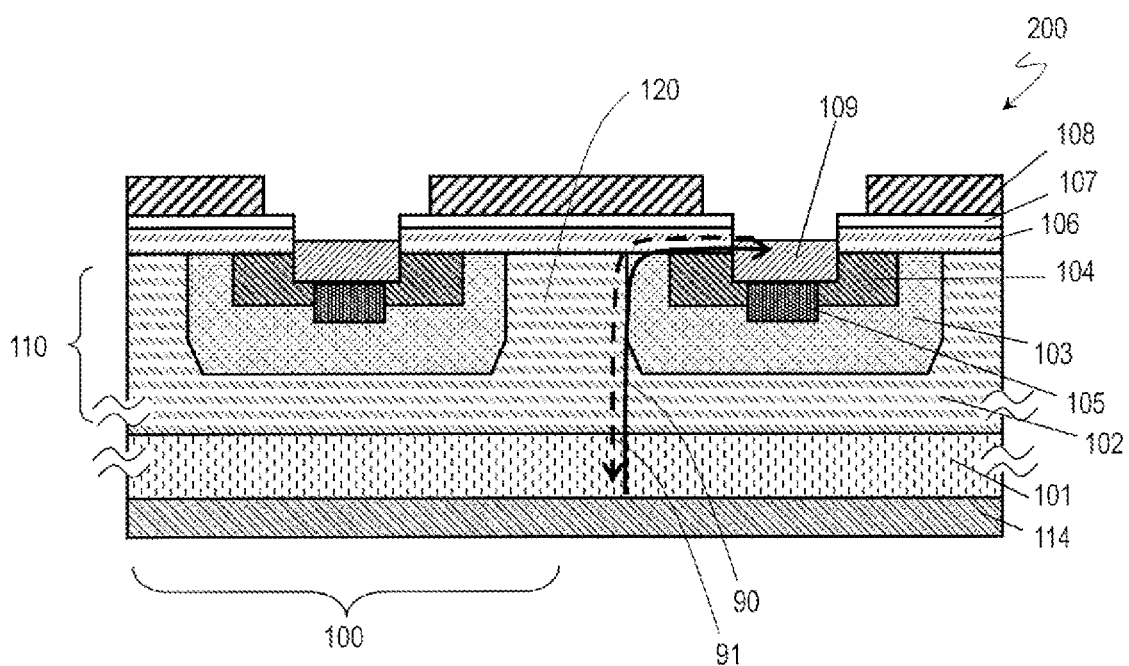
FIG. 1 is a sectional view illustrating a silicon carbide semiconductor element according to an exemplary embodiment.

One aspect of the present disclosure is outlined as follows.

A silicon carbide semiconductor element according to one aspect of the present disclosure includes a plurality of unit cells. Each of the plurality of unit cells includes a substrate, a silicon carbide semiconductor layer, a body region, a source region, a channel layer, a gate insulating film, and a gate electrode. The substrate has a first main surface and a second main surface. The silicon carbide semiconductor layer is of a first conductivity type and is disposed on the first main surface of the substrate. The body region is of a second conductivity type and is in contact with a surface of the silicon carbide semiconductor layer. The source region is of the first conductivity type and is in contact with the body region. The channel layer is made of a silicon carbide semiconductor. The channel layer is disposed above the silicon carbide semiconductor layer so as to be in contact with at least a part of the body region. The gate insulating film is disposed above the channel layer. The gate electrode is disposed above the gate insulating film. The channel layer has a multilayer structure including a high-concentration impurity layer, a first medium-concentration impurity layer, and a first low-concentration impurity layer. The high-concentration impurity layer contains impurities of the first conductivity type in a concentration ranging from $1\times10^{18}/\text{cm}^3$ to $1\times10^{19}/\text{cm}^3$ inclusive. The first medium-concentration impurity layer contains impurities of the first conductivity type in a concentration ranging from more than or equal to $1\times10^{17}/\text{cm}^3$ to less than $1\times10^{18}/\text{cm}^3$. The first low-concentration impurity layer contains impurities of the first conductivity type in a concentration of less than $1\times10^{17}/\text{cm}^3$. The first low-concentration impurity layer is disposed closer to the body region than the high-concentration impurity layer and the first medium-concentration impurity layer.

Herein, for example, the first medium-concentration impurity layer may have a thickness ranging from 5 nm to 30 nm inclusive.

For example, the high-concentration impurity layer may have a thickness ranging from 10 nm to 40 nm inclusive.

For example, the first low-concentration impurity layer may have a thickness ranging from 1 nm to 20 nm inclusive.

For example, the silicon carbide semiconductor element may further include an interface epitaxial layer higher in impurity concentration than the first low-concentration impurity layer. The interface epitaxial layer is disposed at an interface between the channel layer and the body region. The first low-concentration impurity layer may be disposed on the interface epitaxial layer so as to be in contact with the interface epitaxial layer.

For example, the first medium-concentration impurity layer may be disposed between the first low-concentration impurity layer and the high-concentration impurity layer.

For example, the channel layer may further include a second medium-concentration impurity layer that contains impurities of the first conductivity type in a concentration ranging from more than or equal to $1\times10^{17}/\text{cm}^3$ to less than $1\times10^{18}/\text{cm}^3$. For example, the high-concentration impurity layer may be disposed between the first medium-concentration impurity layer and the second medium-concentration impurity layer, and may be in contact with the first medium-concentration impurity layer and the second medium-concentration impurity layer.

For example, the channel layer may further include a second low-concentration impurity layer that contains impurities of the first conductivity type in a concentration of less than $1\times10^{17}/\text{cm}^3$. For example, the high-concentration impurity layer and the first medium-concentration impurity layer may be disposed between the first low-concentration impurity layer and the second low-concentration impurity layer.

For example, the high-concentration impurity layer may be disposed between the first low-concentration impurity layer and the first medium-concentration impurity layer.

For example, in each of the high-concentration impurity layer, the first medium-concentration impurity layer, and the first low-concentration impurity layer, a concentration profile of impurities of the first conductivity type in a thickness direction of the channel layer may include a substantially flat region.

Here, 'thickness direction' is defined as a direction that each layer of a multilayer structure is disposed above the substrate.

For example, each of the plurality of unit cells may further include a source electrode electrically connected to the source region and the body region and a drain electrode disposed on the second main surface of the substrate. In each of the plurality of unit cells, Vds and Vgs respectively represent potentials applied to the drain electrode and the gate electrode relative to the source electrode, and Vth represents a gate threshold voltage. For example, if Vgs Vth, a current may flow from the drain electrode to the source electrode through the channel layer. If Vgs<Vth, as Vds decreases to be lower than 0 V, a current may flow from the source electrode to the drain electrode through the channel layer before a current starts to flow from the body region to the silicon carbide semiconductor layer.

A silicon carbide semiconductor element according another aspect of the present disclosure includes a plurality of unit cells. Each of the plurality of unit cells includes a substrate, a silicon carbide semiconductor layer, a body region, a source region, a channel layer, a gate insulating film, and a gate electrode. The substrate has a first main surface and a second main surface. The silicon carbide semiconductor layer is of a first conductivity type and is disposed on the first main surface of the substrate. The body region is of a second conductivity type and is in contact with a surface of the silicon carbide semiconductor layer. The source region is of the first conductivity type and is in contact with the body region. The channel layer is made of a silicon carbide semiconductor. The channel layer is disposed above the silicon carbide semiconductor layer so as to be in contact with at least a part of the body region. The gate insulating film is disposed above the channel layer. The gate electrode is disposed above the gate insulating film. The channel layer has a multilayer structure including a high-concentration impurity layer, a first medium-concentration impurity layer, and a second medium-concentration impurity layer. The high-concentration impurity layer contains impurities of the first conductivity type in a concentration ranging from $1\times10^{18}/\text{cm}^3$ to $1\times10^{19}/\text{cm}^3$ inclusive. Each of the first medium-concentration impurity layer and the second medium-concentration impurity layer contains impurities of the first conductivity type in a concentration ranging from more than or equal to $1\times10^{17}/\text{cm}^3$ to less than $1\times10^{18}/\text{cm}^3$. The high-concentration impurity layer is disposed between the first medium-concentration impurity layer and the second medium-concentration impurity layer.

For example, each of the first medium-concentration impurity layer and the second medium-concentration impurity layer may have a thickness ranging from 5 nm to 30 nm inclusive.

For example, in each of the high-concentration impurity layer, the first medium-concentration impurity layer, and the second medium-concentration impurity layer, a concentration profile of impurities of the first conductivity type in a thickness direction of the channel layer may include a substantially flat region.

A method for manufacturing a silicon carbide semiconductor element according to one aspect of the present disclosure is a method for manufacturing a silicon carbide semiconductor element. The method for manufacturing the silicon carbide semiconductor element includes a process of preparing a substrate and a process of forming a channel layer.

In the process of preparing the substrate, the substrate has a first main surface and a second main surface. The substrate also has a silicon carbide semiconductor layer of a first conductivity type disposed on the first main surface, a body region of a second conductivity type that is in contact with a surface of the silicon carbide semiconductor layer, and a source region of the first conductivity type that is in contact with the body region.

In the process of forming the channel layer, a source gas and an impurity gas containing impurities of the first conductivity type are supplied onto the surface of the silicon carbide semiconductor layer to allow a silicon carbide semiconductor to epitaxially grow in a chamber. The channel layer is formed above the silicon carbide semiconductor layer so as to bring the channel layer into contact with at least a part of the body region. Further, in the process of forming the channel layer, a channel layer having a multilayer structure of a plurality of layers different in impurity concentrations of the first conductivity type is formed by varying a supply amount of the impurity gas. For example, the plurality of layers includes a high-concentration impurity layer containing impurities of the first conductivity type in a concentration ranging from $1\times10^{18}/cm^3$ to $1\times10^{19}/cm^3$ inclusive, a medium-concentration impurity layer containing impurities of the first conductivity type in a concentration ranging from more than or equal to $1\times10^{17}/cm^3$ to less than $1\times10^{18}/cm^3$, and a low-concentration impurity layer containing impurities of the first conductivity type in a concentration of less than $1\times10^{17}/cm^3$. The low-concentration impurity layer is disposed closer to the body region than the high-concentration impurity layer and the medium-concentration impurity layer. The chamber has a plurality of impurity gas passages for supplying the impurity gas into the chamber. A flow rate of the impurity gas flowing in each of the plurality of impurity gas passages can be controlled independently of each other. At least the high-concentration impurity layer and the medium-concentration impurity layer are formed by supplying the impurity gas, using mutually different impurity gas passages out of the plurality of impurity gas passages.

First Exemplary Embodiment

Hereinafter, with reference to the drawings, a description will be given of a silicon carbide semiconductor element according to a first exemplary embodiment. The silicon carbide semiconductor element according to the present exemplary embodiment is a SiC-MISFET. A MISFET to be described in the present exemplary embodiment is of an n-type as a first conductivity type and a p-type as a second conductivity type. Alternatively, the silicon carbide semiconductor element according to the present exemplary embodiment may be a MISFET which is of a p-type as the first conductivity type and an n-type as the second conductivity type.

The silicon carbide semiconductor element includes a plurality of unit cells arranged in a two-dimensional manner. FIG. 1 is a sectional view of two unit cells 100 in silicon carbide semiconductor element 200.

Each unit cell 100 includes substrate 101 having a first main surface and a second main surface and silicon carbide epitaxial layer (drift layer) 110 on the first main surface of substrate 101. Drain electrode 114 is disposed on the second main surface of substrate 101. Substrate 101 is a part of a silicon carbide wafer. Substrate 101 may be a silicon carbide semiconductor substrate of the first conductivity type. The silicon carbide substrate of the first conductivity type is, for example, an $n^+$ substrate ($n^+$ SiC substrate).

Body region (well region) 103 of the second conductivity type is disposed in silicon carbide epitaxial layer 110. Drift region 102 of the first conductivity type corresponds to a region, where body region 103 is not disposed, of silicon carbide epitaxial layer 110. In a surface of drift region 102, region 120 between adjoining two body regions 103 functions as a JFET region. In the present exemplary embodiment, drift region 102 is of an $n^-$-type, and body region 103 is of a p-type. An impurity concentration in and a thickness of drift region 102 are appropriately changed in accordance with a breakdown voltage required for a semiconductor device.

In the present exemplary embodiment, the first conductivity type is an n-type, and the second conductivity type is a p-type. Alternatively, the first conductivity type may be a p-type, and the second conductivity type may be an n-type. It should be noted that a superscript "+" or "−" in a symbol "$n^+$" or "$n^-$" represents a relative concentration of a dopant. The symbol "$n^+$" indicates that an n-type impurity concentration is higher than an n-type impurity concentration indicated by a symbol "n". The symbol "$n^-$" indicates that an n-type impurity concentration is lower than an n-type impurity concentration indicated by the symbol "n".

Source region 104 of the first conductivity type ($n^+$-type herein) is disposed in body region 103. Contact region 105 of the second conductivity type ($p^+$-type herein) is also disposed in body region 103. Contact region 105 is formed to reduce contact resistance between body region 103 and source electrode 109. It should be noted that contact region 105 is not necessarily formed. In such a case, body region 103 is partially in direct contact with source electrode 109.

Source electrode 109 is provided on source region 104. Source electrode 109 is in electrical contact with both source region 104 of the $n^+$-type and contact region 105 of the $p^+$-type. As illustrated in FIG. 1, source electrode 109 is in contact with channel layer 106. Alternatively, source electrode 109 may be out of contact with channel layer 106.

Channel layer 106 is formed on silicon carbide epitaxial layer 110 so as to be in contact with body region 103. Channel layer 106 is mainly made of a silicon carbide semiconductor, and contains impurities of the first conductivity type. Channel layer 106 interconnects source region 104 and JFET region 120. For example, channel layer 106 is formed through epitaxial growth on silicon carbide epitaxial layer 110. In channel layer 106, a portion that lies between body region 103 and gate electrode 108 functions as a channel region. In the present exemplary embodiment, channel layer 106 has a multilayer structure of three or more layers. A specific structure of channel layer 106 will be described later.

Gate insulating film 107 is disposed on channel layer 106. Gate insulating film 107 has a thickness that is appropriately selected in accordance with a voltage to be applied to gate electrode 108. Gate electrode 108 is disposed on gate insulating film 107. Gate electrode 108 covers at least a portion, which lies between JFET region 120 and source regions 104, of a surface of body region 103.

The plurality of unit cells 100 are electrically connected to each other with gate electrode 108 formed in a single component, for example. Gate electrode 108 is electrically connected to a gate pad (not illustrated). In the plurality of unit cells 100, source electrodes 109 are electrically connected to each other via a source wire (not illustrated). The source wire is electrically connected to a source pad (not illustrated).

Silicon carbide semiconductor element (SiC-MISFET) 200 in a transistor OFF state may function as a diode that allows a flow of current from source electrode 109 to drain electrode 114 via channel layer 106. Such a diode is referred to as a "channel diode". In this description, a direction from drain electrode 114 to source electrode 109 is defined as a "forward direction", and a direction from source electrode 109 to drain electrode 114 is defined as a "reverse direction". The channel diode allows a flow of current in the "reverse direction". Absolute value |Vf0| of a rising voltage of the channel diode is set to be smaller than absolute value |Vfb| of a rising voltage of a diode employing a pn junction in silicon carbide semiconductor element 200 (hereinafter, such a diode will be referred to as a "body diode").

It is assumed herein that the SiC-MISFET is used as a switching element for a power converter. In this case, the SiC-MISFET in an OFF state occasionally allows a flow of reflux current to the power converter. In a typical inverter circuit, an external reflux diode, such as an SBD, is connected in anti-parallel to a SiC-MISFET, so that the reflux diode serves as a reflux current path. On the other hand, a SiC-MISFET incorporating a channel diode has no necessity of an external reflux diode, and therefore contributes to a reduction in parts count.

A more specific description will be given of silicon carbide semiconductor element 200 incorporating the channel diode. When Vgs represents a potential of gate electrode 108 relative to a potential of source electrodes 109 and Vth represents a gate threshold voltage, if Vgs≥Vth, a current flows in the forward direction (transistor ON mode). Herein, an on-state current flows from drain electrode 114 to source electrode 109 through channel layer 106 in a direction of arrow 90. On the other hand, if 0 V≤Vgs<Vth, no current flows in the forward direction (transistor OFF mode). In the transistor OFF mode, as Vds decreases to be lower than 0 V, a current flows from source electrode 109 to drain electrode 114 through channel layer 106 in a direction of arrow 91 before a current starts to flow from body region 103 to silicon carbide epitaxial layer 110. In other words, when Vds<0 (V), silicon carbide semiconductor element 200 functions as a channel diode that allows a flow of current in the reverse direction. Such a configuration is attained by appropriately controlling, for example, an impurity concentration and a thickness of channel layer 106, and the thickness of gate insulating film 107.

<Structure of Channel Layer 106>

For example, channel layer 106 is a silicon carbide epitaxial layer containing an impurity equal in conductivity type (e.g., n-type) to drift region 102.

Channel layer 106 has a multilayer structure of a plurality of layers that are different in impurity concentration from one another. For example, channel layer 106 has a multilayer structure of a high-concentration impurity layer containing impurities of the first conductivity type in a concentration ranging from $1\times10^{18}/cm^3$ to $1\times10^{19}/cm^3$ inclusive, a low-concentration impurity layer containing impurities of the first conductivity type in a concentration of less than $1\times10^{17}/cm^3$, and a medium-concentration impurity layer containing impurities of the first conductivity type in a concentration ranging from more than or equal to $1\times10^{17}/cm^3$ to less than $1\times10^{18}/cm^3$. The impurity concentration in the high-concentration impurity layer is adjusted for desired element characteristics (for example, threshold voltages in the forward direction and the reverse direction). The low-concentration impurity layer is disposed closer to body region 103 than the high-concentration impurity layer and the medium-concentration impurity layer.

For example, the multilayer structure of channel layer 106 includes at least one high-concentration impurity layer, at least one low-concentration impurity layer, and at least one medium-concentration impurity layer. As will be described later, in the multilayer structure, the number of impurity layers may be two or more. When channel layer 106 includes two or more low-concentration impurity layers, at least one of the low-concentration impurity layers may be disposed closer to body region 103 than the high-concentration impurity layer and the medium-concentration impurity layer.

Each low-concentration impurity layer may be an undoped layer containing substantially no impurity. The "undoped layer" refers to a layer formed without positively carrying out a process of adding an impurity, and includes, for example, a layer formed by bringing silicon carbide into epitaxial growth without supplying an impurity gas into a chamber.

According to the present exemplary embodiment, channel layer 106 includes, in addition to the high-concentration impurity layer, the low-concentration impurity layer and the medium-concentration impurity layer. This configuration enables a reduction in on-resistance while suppressing variations in characteristic in a plane that is parallel to a first main surface of a silicon carbide wafer (hereinafter, such a plane will be referred to as a "wafer plane"). By suppressing variations in threshold voltage Vth and the like in the wafer plane, a yield and productivity can be improved. Therefore, a silicon carbide semiconductor element of low power loss that can be manufactured with high productivity can be provided. Details are described below.

As described in WO 2013/140473 by the present applicant, when channel layer 106 is formed by epitaxial growth of silicon carbide, an interface epitaxial layer high in impurity concentration may be formed at an interface between channel layer 106 and body region 103. The interface epitaxial layer is formed when impurities, such as nitrogen, absorbed by the chamber is unintentionally introduced into an epitaxial film at an initial stage of the epitaxial growth. When the impurity concentration in the interface epitaxial layer is high (for example, more than or equal to $1\times10^{18}/cm^3$), a desired threshold voltage may not be obtained.

Further, variations in impurity concentration and thickness can occur in the interface epitaxial layer within the wafer plane caused by, for example, crystal quality distribution of the wafer, damage amount distribution by ion implantation, substrate temperature distribution during the epitaxial growth. When the impurity concentration in the interface epitaxial layer is high, a variation in gate threshold voltage Vth (hereinafter, "threshold voltage Vth") may occur in the wafer plane due to the variations in the interface epitaxial layer. In this description, the variation in the wafer plane may be abbreviated as "in-plane variation".

In the present exemplary embodiment, the low-concentration impurity layer in an impurity concentration of less than $1\times10^{17}/cm^{-3}$ is formed closer to body region 103 than the high-concentration impurity layer and the medium-concentration impurity layer. Since an amount of impurity gas supplied onto substrate 101 at the initial stage of the epitaxial growth can be reduced, an impurity concentration in the interface epitaxial layer formed at the initial stage of the epitaxial growth can be suppressed to be lower than the impurity concentration in the high-concentration impurity layer, for example. Even if the interface epitaxial layer is formed, the impurity concentration in the interface epitaxial layer is lower than the impurity concentration in the high-concentration impurity layer. Accordingly, an influence of the interface epitaxial layer on the characteristic, such as threshold voltage Vth, can be reduced. Therefore, desired threshold voltage Vth can be obtained, and an in-plane variation in threshold voltage Vth caused by the interface epitaxial layer can be reduced.

The low-concentration impurity layer may be formed as a bottom layer of channel layer 106. Thereby, the impurity concentration in the interface epitaxial layer can be reduced more effectively. In this case, the low-concentration impurity layer can be disposed on the interface epitaxial layer so as to be in contact with the interface epitaxial layer.

However, when the low-concentration impurity layer is introduced, on-resistance is likely to increase. On the other hand, channel layer 106 in the present exemplary embodiment includes the medium-concentration impurity layer higher in impurity concentration than the low-concentration impurity layer. As a result, the on-resistance of channel layer 106 can be reduced more than a multilayered channel layer including only a low-concentration impurity layer and a high-concentration impurity layer.

It can be assumed that the high-concentration impurity layer is thickened to decrease the on-resistance. However, when the high-concentration impurity layer is thickened, an influence of an in-plane variation in thickness of the high-concentration impurity layer on threshold voltage Vth becomes large, and a variation in threshold voltage Vth may be increased in the wafer plane. On the other hand, when the medium-concentration impurity layer is provided, the impurity concentration in the medium-concentration impurity layer is lower than the impurity concentration in the high-concentration impurity layer and is less than $1\times10^{18}/cm^3$. Accordingly, an influence of the variation in thickness on the characteristic, such as threshold voltage Vth, can be made small. Therefore, the on-resistance can be reduced while suppressing the increase in in-plane variation in threshold voltage Vth. By suppressing the in-plane variation in threshold voltage Vth, a yield and productivity can be improved.

The medium-concentration impurity layer may be disposed closer to the high-concentration impurity layer than the low-concentration impurity layer. Therefore, the on-resistance can be further effectively reduced. For example, the medium-concentration impurity layer may be in contact with the high-concentration impurity layer. As described below, two medium-concentration impurity layers may be disposed so as to sandwich the high-concentration impurity layer.

Hereinafter, a structure of channel layer 106 will be more specifically described.

Figure 2A:
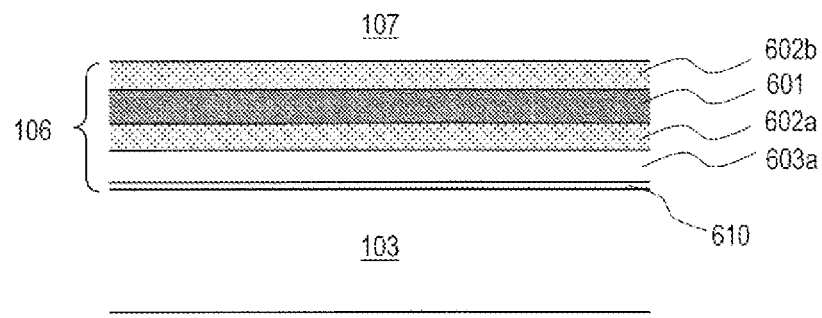
FIG. 2A is a sectional view illustrating a channel layer in the silicon carbide semiconductor element.
Figure 2B:
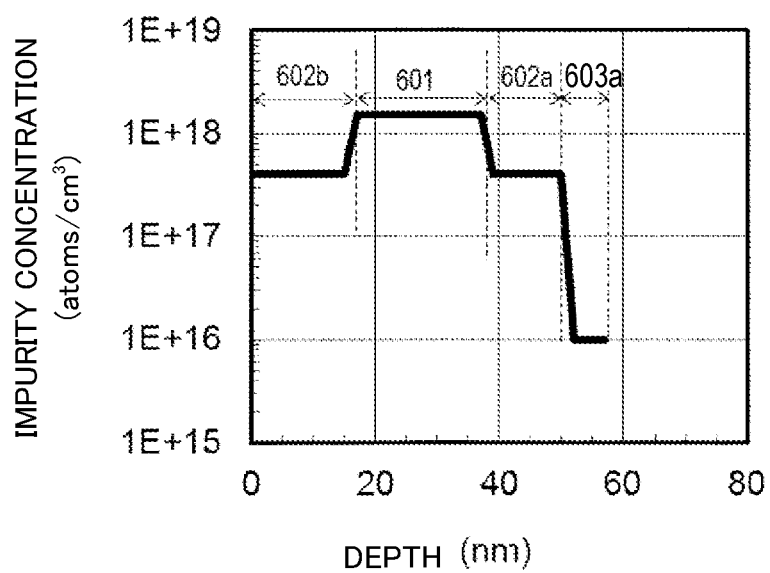
FIG. 2B is a graph illustrating an impurity concentration profile in a thickness direction of the channel layer.

FIG. 2A is a schematic sectional view illustrating channel layer 106 in the present exemplary embodiment. FIG. 2B is a schematic view illustrating an impurity concentration profile in a thickness direction of channel layer 106. In FIG. 2B, a vertical axis shows an impurity concentration of the first conductivity type, and a horizontal axis shows a depth of channel layer 106 from a surface on gate insulating film 107 side. The impurity concentration profile means impurity concentration distribution. FIG. 2B includes "E" representing a power of 10. For example, "1E+17" represents $1\times10^{17}$. Further, a scale on the vertical axis in FIG. 2B functions as a logarithmic scale. Similarly, in FIGS. 3B, 4B, 5B, 6B, 7A, and 7B, "E" represents a power of 10, and a scale on a vertical axis functions as a logarithmic scale.

Channel layer 106 has a multilayer structure including high-concentration impurity layer 601, low-concentration impurity layer 603a, and two medium-concentration impurity layers 602a, 602b. In this example, low-concentration impurity layer 603a, medium-concentration impurity layer 602a, high-concentration impurity layer 601, and medium-concentration impurity layer 602b are multilayered in this order from body region 103 side. The impurities of the first conductivity type contained in channel layer 106 are not particularly limited, and may be, for example, nitrogen as n-type impurities.

As illustrated in FIG. 2A, interface epitaxial layer 610 higher in impurity concentration than low-concentration impurity layer 603a may be formed at an interface between channel layer 106 and body region 103. Low-concentration impurity layer 603a may be disposed on interface epitaxial layer 610 so as to be in contact with interface epitaxial layer 610. For example, interface epitaxial layer 610 has a thickness ranging from more than 0 to less than or equal to 10 nm and has an impurity concentration ranging from $1\times10^{16}/cm^3$ to $1\times10^{18}/cm^3$ inclusive.

Low-concentration impurity layer 603a is formed as a bottom layer of channel layer 106, and is disposed closer to body region 103 than high-concentration impurity layer 601 and medium-concentration impurity layers 602a, 602b. Therefore, a variation in threshold voltage Vth in the wafer plane caused by a variation in impurity concentration in interface epitaxial layer 610 can be reduced.

Medium-concentration impurity layer (sometimes referred to as a "first medium-concentration impurity layer") 602a is disposed between low-concentration impurity layer 603a and high-concentration impurity layer 601. Medium-concentration impurity layer (sometimes referred to as a "second medium-concentration impurity layer") 602b is disposed on high-concentration impurity layer 601. In other words, high-concentration impurity layer 601 is disposed between medium-concentration impurity layer 602a and medium-concentration impurity layer 602b. High-concentration impurity layer 601 may be in contact with medium-concentration impurity layer 602a and medium-concentration impurity layer 602b. By providing medium-concentration impurity layers 602a, 602b adjacent to high-concentration impurity layer 601, on-resistance can be reduced more effectively.

Further, by providing medium-concentration impurity layer 602b or a low-concentration impurity layer on high-concentration impurity layer 601, that is, between high-concentration impurity layer 601 and gate insulating film 107, process damage to high-concentration impurity layer 601 can be suppressed in a process of forming gate insulating film 107. Furthermore, when a thermal oxide film is formed as gate insulating film 107, an in-plane variation in threshold voltage Vth caused by a process of forming the thermal oxide film can be reduced. In the process of forming the thermal oxide film, a surface of channel layer 106 is oxidized, and a thickness of channel layer 106 can be decreased. At this time, when an upper surface of channel layer 106 includes high-concentration impurity layer 601, high-concentration impurity layer 601 becomes thinner in thickness, and an in-plane variation in thickness can thus cause variations in electric characteristics including a gate threshold voltage in the forward direction and a rising voltage in the reverse direction. On the other hand, when medium-concentration impurity layer 602b and/or the low-concentration impurity layer are formed on high-concentration impurity layer 601, the decrease in thickness of high-concentration impurity layer 601 having high Vth sensitivity can be suppressed. Therefore, the in-plane variation in threshold voltage Vth can be suppressed more effectively.

Next, a thickness of each layer in channel layer 106 will be described. The thickness described herein is a thickness of completed silicon carbide semiconductor element 200.

For example, high-concentration impurity layer 601 has a thickness of more than or equal to 10 nm. As a result, a desired on-state current can be obtained more reliably. On the other hand, when high-concentration impurity layer 601 becomes too thick, a variation in threshold voltage Vth caused by the variation in thickness of high-concentration impurity layer 601 may be increased. Accordingly, high-concentration impurity layer 601 may have a thickness of less than or equal to 40 nm, for example. The thickness of and an impurity concentration in high-concentration impurity layer 601 may advantageously be controlled so that silicon carbide semiconductor element 200 can function as a channel diode.

Low-concentration impurity layer 603a may have a thickness of more than or equal to 1 nm, for example. Thereby, the impurity concentration in interface epitaxial layer 610 can be reduced more effectively. Low-concentration impurity layer 603a may have a thickness of less than or equal to 20 nm. As a result, an increase in on-resistance can be suppressed.

Medium-concentration impurity layer 602a may have a thickness of more than or equal to 5 nm, for example. Therefore, the on-resistance can be further effectively reduced. Further, medium-concentration impurity layer 602a may have a thickness of less than or equal to 30 nm. Therefore, the on-resistance can be further effectively reduced while suppressing an increase in in-plane variation in threshold voltage Vth.

A top layer of channel layer 106, that is, medium-concentration impurity layer 602b in this example, also functions as a protective layer for protecting high-concentration impurity layer 601. When a thermal oxide film is formed as gate insulating film 107, a surface of the top layer of channel layer 106 is oxidized. A thickness of the top layer subjected to the thermal oxidation is changed according to an amount lost by the oxidation. Accordingly, the thickness of the top layer is difficult to determine, and may range from 5 nm to 30 nm inclusive, for example.

Further, it is preferable that a total thickness of medium-concentration impurity layer 602a and medium-concentration impurity layer 602b be more than or equal to half of the thickness of high-concentration impurity layer 601. Therefore, the on-resistance can be further effectively reduced.

A kind of impurities of the first conductivity type introduced into high-concentration impurity layer 601, medium-concentration impurity layers 602a, 602b, and low-concentration impurity layer 603a is not particularly limited. When the first conductivity type is an n-type, nitrogen or phosphorous can be used as n-type impurities, for example. When the first conductivity type is a p-type, aluminum or boron can be used as p-type impurities, for example. All the impurity layers constituting channel layer 106 may contain identical impurities or may contain different kinds of impurities.

Modifications of channel layer 106 according to the present exemplary embodiment will now be described.

Figure 3A:
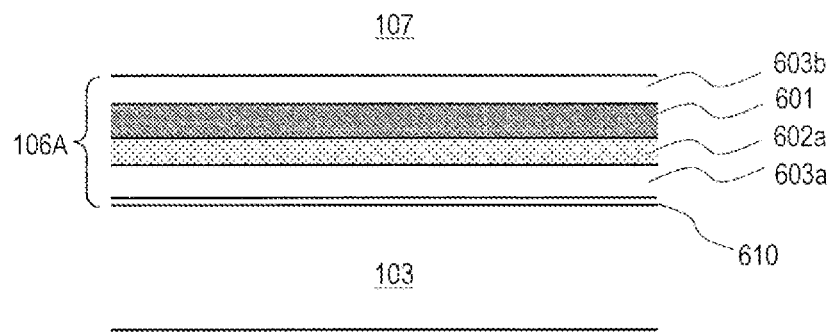
FIG. 3A is a sectional view illustrating another channel layer in the silicon carbide semiconductor element.
Figure 3B:
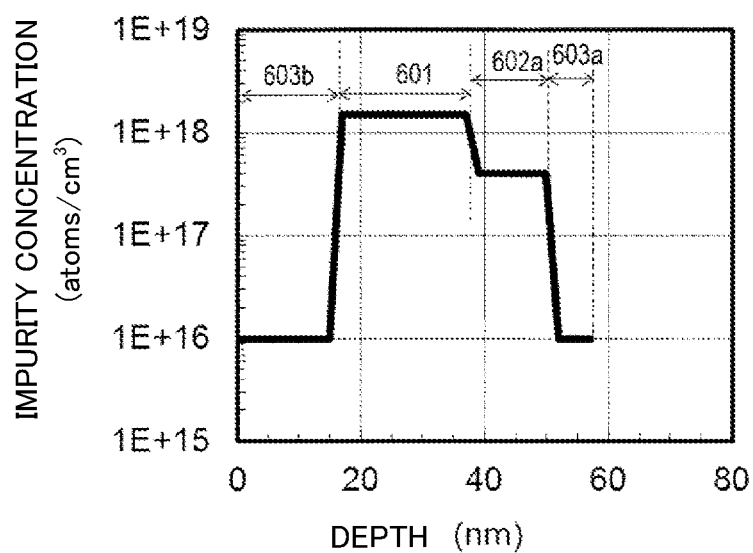
FIG. 3B is a graph illustrating an impurity concentration profile in a thickness direction of the channel layer.

FIG. 3A is a schematic sectional view illustrating channel layer 106A in a first modification. FIG. 3B is a schematic view illustrating an impurity concentration profile in a thickness direction of channel layer 106A.

Channel layer 106A has low-concentration impurity layer 603a, medium-concentration impurity layer 602a, high-concentration impurity layer 601, and low-concentration impurity layer 603b in this order from body region 103 side. Channel layer 106A is different from channel layer 106 illustrated in FIG. 2A in that low-concentration impurity layer 603b is disposed on high-concentration impurity layer 601 so as to be in contact with high-concentration impurity layer 601. By providing low-concentration impurity layer 603b having a lower impurity concentration as a top layer of channel layer 106A, a variation in characteristic caused by a variation in amount lost by thermal oxidation of channel layer 106A can be reduced more effectively.

Thicknesses of low-concentration impurity layer 603a, medium-concentration impurity layer 602a, and high-concentration impurity layer 601 may be respectively identical to thicknesses of low-concentration impurity layer 603a, medium-concentration impurity layer 602a, and high-concentration impurity layer 601 in channel layer 106 illustrated in FIG. 2A. A thickness of low-concentration impurity layer 603b is changed according to an amount lost by the thermal oxidation. Accordingly, the thickness of low-concentration impurity layer 603b is difficult to determine, and may range from 5 nm to 30 nm inclusive, for example.

Figure 4A:
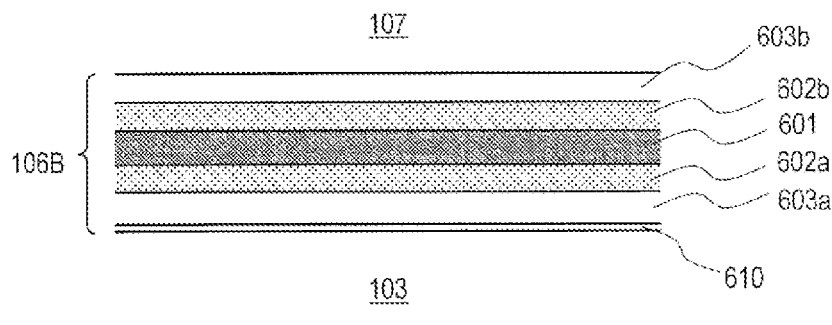
FIG. 4A is a sectional view illustrating a still another channel layer in the silicon carbide semiconductor element.
Figure 4B:
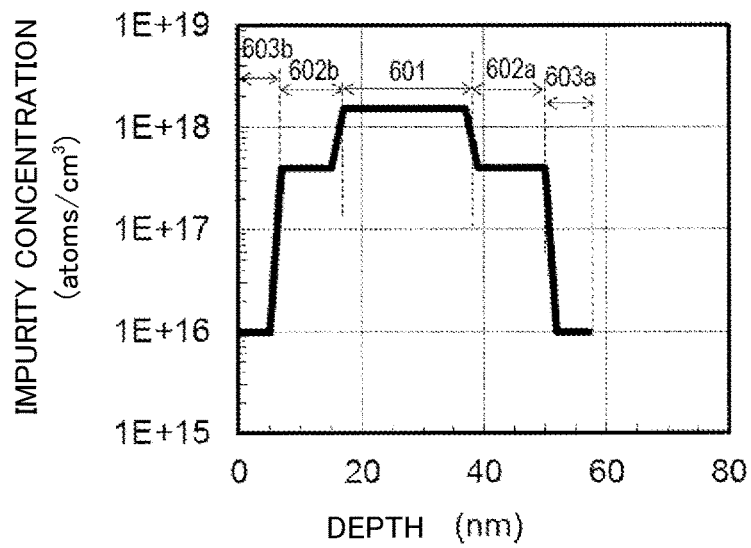
FIG. 4B is a graph illustrating an impurity concentration profile in a thickness direction of the channel layer.

FIG. 4A is a schematic sectional view illustrating channel layer 106B in a second modification. FIG. 4B is a schematic view illustrating an impurity concentration profile in a thickness direction of channel layer 106B.

Channel layer 106B has low-concentration impurity layer 603a, medium-concentration impurity layer 602a, high-concentration impurity layer 601, medium-concentration impurity layer 602b, and low-concentration impurity layer 603b in this order from body region 103 side. Channel layer 106B is different from channel layer 106 illustrated in FIG. 2A in that another low-concentration impurity layer 603b is further disposed on medium-concentration impurity layer 602b. By providing low-concentration impurity layer 603b as a top layer of channel layer 106B, a variation in characteristic caused by a variation in amount lost by thermal oxidation of channel layer 106B can be reduced more effectively. Since medium-concentration impurity layers 602a, 602b are provided so as to sandwich high-concentration impurity layer 601, on-resistance can be reduced more effectively.

Thicknesses of low-concentration impurity layer 603a, medium-concentration impurity layer 602a, high-concentration impurity layer 601, and low-concentration impurity layer 603b may be respectively identical to thicknesses of low-concentration impurity layer 603a, medium-concentration impurity layer 602a, high-concentration impurity layer 601, and low-concentration impurity layer 603b in channel layer 106A illustrated in FIG. 3A. As with medium-concentration impurity layer 602a, medium-concentration impurity layer 602b may have a thickness ranging from 5 nm to 30 nm inclusive.

Figure 5A:
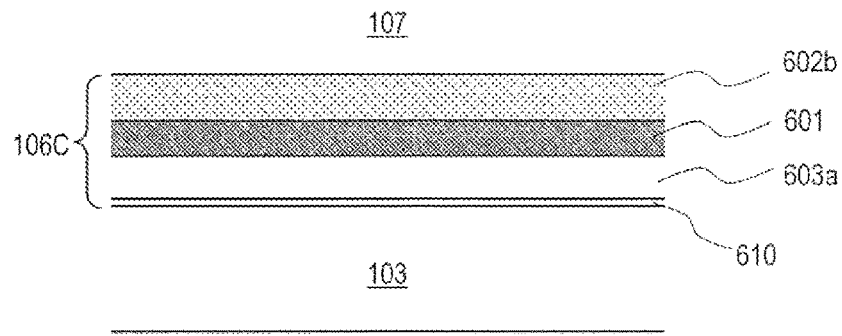
FIG. 5A is a sectional view illustrating a yet another channel layer in the silicon carbide semiconductor element.
Figure 5B:
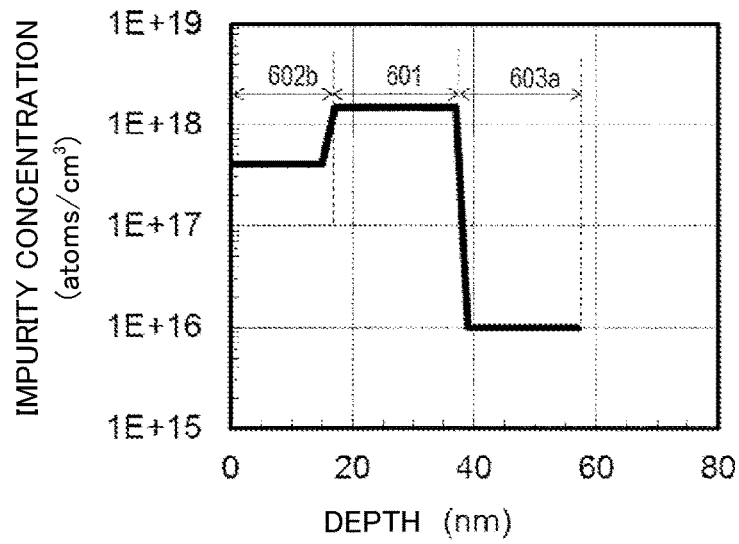
FIG. 5B is a graph illustrating an impurity concentration profile in a thickness direction of the channel layer.

FIG. 5A is a schematic sectional view illustrating channel layer 106C in a third modification. FIG. 5B is a schematic view illustrating an impurity concentration profile in a thickness direction of channel layer 106C.

Channel layer 106C includes low-concentration impurity layer 603a, high-concentration impurity layer 601, and medium-concentration impurity layer 602b from body region 103 side. Channel layer 106C is different from channel layer 106 illustrated in FIG. 2A in that a medium-concentration impurity layer is not included between high-concentration impurity layer 601 and low-concentration impurity layer 603a.

Thicknesses of low-concentration impurity layer 603a, high-concentration impurity layer 601, and medium-concentration impurity layer 602b may be respectively identical to thicknesses of low-concentration impurity layer 603a, high-concentration impurity layer 601, and medium-concentration impurity layer 602b in channel layer 106 illustrated in FIG. 2A.

Channel layer 106 according to the present exemplary embodiment may not have a low-concentration impurity layer.

Figure 6A:
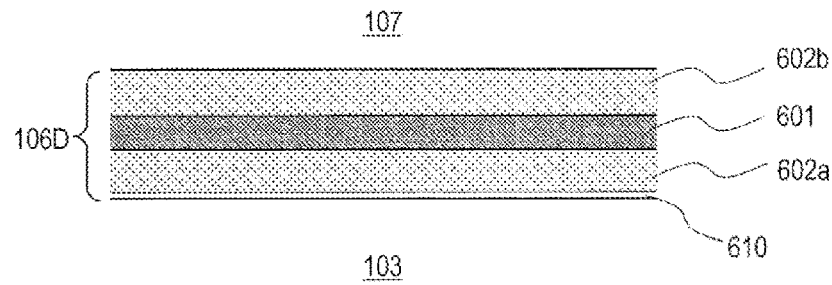
FIG. 6A is a sectional view illustrating a yet another channel layer in the silicon carbide semiconductor element.
Figure 6B:
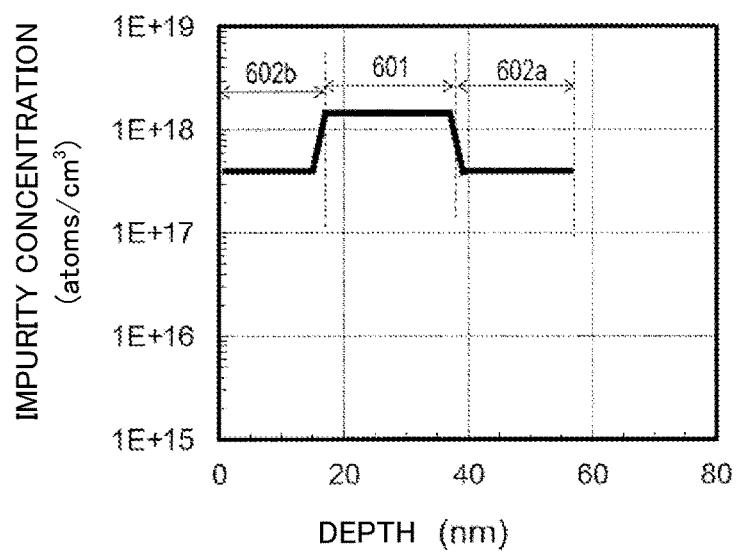
FIG. 6B is a graph illustrating an impurity concentration profile in a thickness direction of the channel layer.

FIG. 6A is a schematic sectional view illustrating channel layer 106D in a fourth modification. FIG. 6B is a schematic view illustrating an impurity concentration profile in a thickness direction of channel layer 106D.

Channel layer 106D does not have a low-concentration impurity layer. In channel layer 106D, medium-concentration impurity layer 602a is disposed so as to be in contact with interface epitaxial layer 610, and high-concentration impurity layer 601 and medium-concentration impurity layer 602b are formed on medium-concentration impurity layer 602a in this order. Since medium-concentration impurity layers 602a, 602b are also disposed so as to sandwich high-concentration impurity layer 601 in this configuration, on-resistance can be reduced.

Thicknesses of medium-concentration impurity layer 602a, high-concentration impurity layer 601, and medium-concentration impurity layer 602b may be respectively identical to thicknesses of medium-concentration impurity layer 602a, high-concentration impurity layer 601, and medium-concentration impurity layer 602b in channel layer 106 illustrated in FIG. 2A.

Although interface epitaxial layer 610 is illustrated in FIGS. 2A to 6A, interface epitaxial layer 610 may not be formed. For example, depending on epitaxial growth conditions, a CVD apparatus to be used, or the like, a region having an impurity concentration sufficiently higher than the bottom layer of channel layer 106 may not be formed at the interface between body region 103 and channel layer 106. When interface epitaxial layer 610 is thin or an impurity concentration in interface epitaxial layer 610 is low, interface epitaxial layer 610 may not be distinguished from the bottom layer of channel layer 106. When epitaxial growth is performed under conditions that interface epitaxial layer 610 is difficult to form, a low-concentration impurity layer may not be formed as the bottom layer of channel layer 106.

Furthermore, even if low-concentration impurity layer 603a is formed as the bottom layer of channel layer 106, when growth time of low-concentration impurity layer 603a is too short, low-concentration impurity layer 603a located on interface epitaxial layer 610 is thinned, and low-concentration impurity layer 603a may be difficult to confirm. As a result, as illustrated in FIG. 6A, it is possible to obtain a structure in which medium-concentration impurity layer 602a is disposed so as to be in contact with interface epitaxial layer 610. At this time, the impurity concentrations of interface epitaxial layer 610 and medium-concentration impurity layer 602a are almost identical, so that interface epitaxial layer 610 may not be specified.

As illustrated in FIGS. 2B to 6B, the impurity concentration in the thickness direction of each of the impurity layers may be substantially constant. In other words, in each of high-concentration impurity layer 601, medium-concentration impurity layers 602a, 602b, and low-concentration impurity layers 603a, 603b, the impurity concentration profile may have a substantially flat region. Channel layer 106 having such an impurity concentration profile can be formed by, for example, switching the gas passages for introducing an impurity gas into the chamber to perform flow control of the impurity gas during formation of each of the impurity layers. A specific method will be described below. By controlling the impurity concentration in the thickness direction of each of the impurity layers at a substantially constant level, threshold voltage Vth can be controlled with high precision, and an in-plane variation in threshold voltage Vth can be reduced more effectively.

Figure 7A:
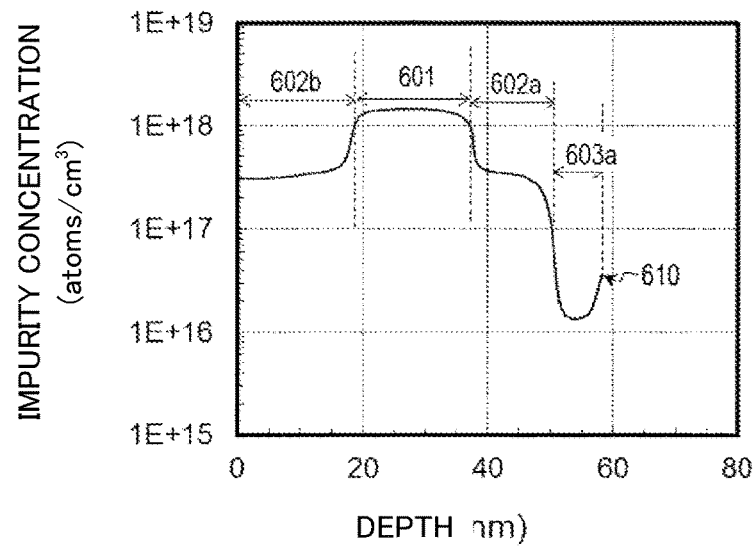
FIG. 7A is a graph illustrating another example of impurity concentration profile in the thickness direction of the channel layer illustrated in FIG. 2A.
Figure 7B:
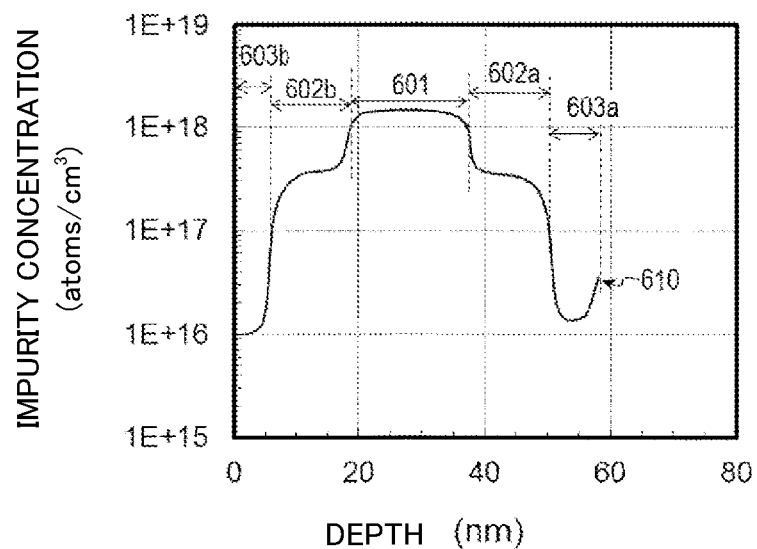
FIG. 7B is a graph illustrating another example of impurity concentration profile in the thickness direction of the channel layer illustrated in FIG. 4A.

FIGS. 7A and 7B illustrate other examples of impurity concentration profiles of channel layer 106 illustrated in FIG. 2A and channel layer 106B illustrated in FIG. 4A, respectively. As illustrated in FIGS. 7A, 7B, the impurity concentration profile of channel layer 106, 106B is somewhat rounded (dull) near an interface between two adjacent layers. In this case, the impurity concentration profile of each of the impurity layers can have a substantially flat region. Although not illustrated in the drawings, the same applies to other channel layers 106A, 106C, 106D.

<Method for Manufacturing Silicon Carbide Semiconductor Element 200>

Next, a method for manufacturing silicon carbide semiconductor element 200 according to the present exemplary embodiment will be described with reference to the accompanying drawings.

Figure 8A:
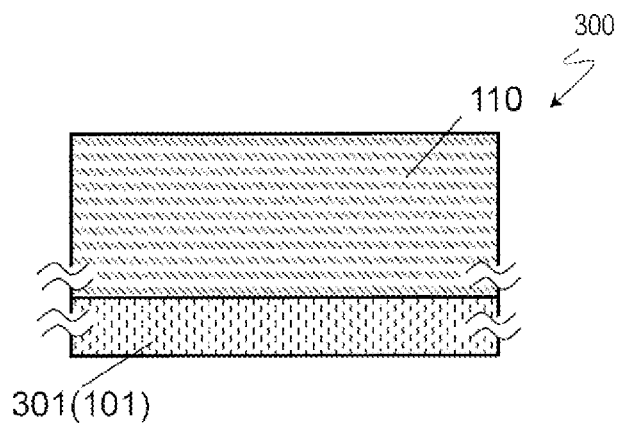
FIG. 8A is a sectional view of a process used to illustrate a method for manufacturing the silicon carbide semiconductor element.

FIGS. 8A to 8F are sectional views used to illustrate the method for manufacturing silicon carbide semiconductor element 200. FIG. 8A illustrates silicon carbide epitaxial wafer 300. FIGS. 8B to 8F illustrate unit cell forming region Ru where one unit cell is formed.

As illustrated in FIG. 8A, first conductivity type (n-type) silicon carbide epitaxial layer 110 is first allowed to epitaxially grow on the main surface of substrate 101 (silicon carbide wafer 301).

As substrate 101, for example, an off cut substrate in which a 4H-SiC (0001) surface is inclined by four degrees in a [11-20] direction is used. Substrate 101 is an n-type, and an impurity concentration in substrate 101 ranges from approximately $5 \times 10^{18}$ cm$^{-3}$ to approximately $5 \times 10^{19}$ cm$^{-3}$, for example.

Before allowing silicon carbide epitaxial layer 110 to epitaxially grow in a forming process, substrate 101 is first heated. In this heating process, no source gas is supplied, and substrate 101 is heated under an atmosphere filled with at least hydrogen. At the time when substrate 101 is heated to a predetermined growth temperature (wafer temperature, 1600° C. herein), a source gas and a nitrogen gas that is a dopant gas (impurity gas) are supplied. As described above, silicon carbide epitaxial layer 110 is formed on the main surface of substrate 101 in a thickness ranging from approximately 5 µm to approximately 100 µm (e.g., 10 µm), for example. Silicon carbide epitaxial layer 110 has an n-type impurity concentration ranging from $1 \times 10^{14}$ cm$^{-3}$ to $1 \times 10^{17}$ cm$^{-3}$ inclusive (e.g., $1 \times 10^{16}$ cm$^{-3}$), for example, which is set lower than an n-type impurity concentration in silicon carbide wafer 301.

Figure 8B:
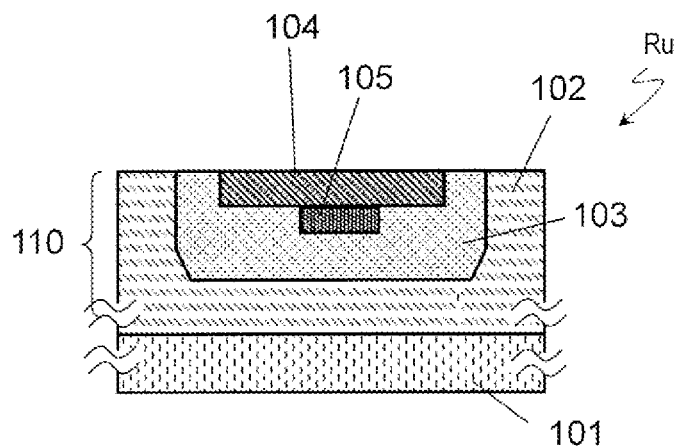
FIG. 8B is a sectional view of the process used to illustrate the method for manufacturing the silicon carbide semiconductor element.

Next, as illustrated in FIG. 8B, within unit cell forming region Ru, p-type or n-type impurity ions are implanted into a selected region of silicon carbide epitaxial layer 110 to form body region 103, source region 104, and contact region 105.

Specifically, on silicon carbide epitaxial layer 110, a mask made of $SiO_2$ (not shown) is formed, for example, and then p-type impurity ions (e.g., Al ions or B ions) are implanted into a region where no mask is formed to form body region 103. Body region 103 has a width ranging from 5 µm to 10 µm, for example. A p-type impurity concentration in body region 103 ranges from $1 \times 10^{17}$ cm$^{-3}$ to $1 \times 10^{20}$ cm$^{-3}$ inclusive, for example.

N-type impurity ions (e.g., nitrogen ions) are further implanted into contact region 105 to form source region 104. An n-type impurity concentration in source region 104 ranges from $1 \times 10^{18}$ cm$^{-3}$ to $1 \times 10^{21}$ cm$^{-3}$ inclusive, for example.

Within body region 103, p-type impurity ions are implanted to form contact region 105. A p-type impurity concentration in contact region 105 ranges from $1 \times 10^{19}$ cm$^{-3}$ to $1 \times 10^{21}$ cm$^{-3}$ inclusive, for example.

After the ions are implanted, the mask is removed to perform activation annealing. For example, the activation annealing is performed at a temperature of approximately 1700° C. under an inert atmosphere for approximately 30 minutes.

Figure 8C:
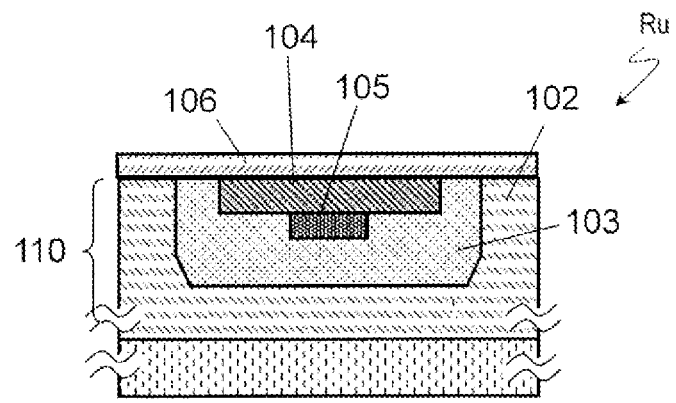
FIG. 8C is a sectional view of the process used to illustrate the method for manufacturing the silicon carbide semiconductor element.

Next, as illustrated in FIG. 8C, channel layer 106 is formed by allowing silicon carbide to epitaxially grow over a surface of silicon carbide epitaxial layer 110 including body region 103, source region 104, and contact region 105.

In the present exemplary embodiment, channel layer 106 is formed using a chemical vapor deposition (CVD) method. Specifically, while substrate 101 is heated, a silicon-based gas, such as a silane gas, a carbon-based gas, such as a propane gas, and as necessary, a dopant gas (impurity gas) containing n-type impurities are supplied. As the impurity gas, a nitrogen gas is used, for example. For example, a growth temperature ranges from 1450° C. to 1650° C. inclusive, and a growth pressure ranges from 50 hPa to 300 hPa inclusive. For example, under standard conditions (0° C., 1 atm), flow rates of the source gases are as follows: a flow rate of $SiH_4$ ranges from 10 ml/min to 30 ml/min; a flow rate of $C_3H_8$ ranges from 3 ml/min to 15 ml/min; and a flow rate of $H_2$ ranges from 50 l/min to 200 l/min Thicknesses and impurity concentrations of the layers constituting channel layer 106 can be controlled by growth conditions, such as a supply amount and a supply time of an impurity gas.

Formation of a channel layer according to the present exemplary embodiment will be described more specifically using channel layer 106 illustrated in FIG. 2A as an example.

A CVD apparatus used in the present exemplary embodiment includes a chamber, a source gas passage for introducing a source gas into the chamber, and a plurality of impurity gas passages for introducing an impurity gas into the chamber. For example, the CVD apparatus may include a first impurity gas passage for forming a high-concentration impurity layer, a second impurity gas passage for forming a medium-concentration impurity layer, and a third impurity gas passage for forming a low-concentration impurity layer. Each of the impurity gas passages may be provided with a flow rate controller for controlling a flow rate of an impurity gas, such as a mass flow controller. As a result, flow rates of impurity gases supplied from these impurity gas passages to the chamber can be independently controlled for each of the impurity gas passages. Therefore, the flow rates of the impurity gases can be adjusted by switching the impurity gas passages for supplying the impurity gases.

First, within the chamber of the CVD apparatus, the source gas and the impurity gas are supplied to substrate 101 formed with silicon carbide epitaxial layer 110 to form low-concentration impurity layer 603a. Herein, the source gas is supplied by using the source gas passage, and the impurity gas is supplied by using the third impurity gas passage. Flow rates of these gases can be controlled so as to obtain desired impurity concentrations. By supplying only the source gas without supplying the impurity gas, low-concentration impurity layer 603a which substantially contains no impurities may be formed. Although not illustrated in FIG. 8C, impurities, such as nitrogen, absorbed by the chamber are unintentionally introduced into the epitaxial layer at an initial stage of the epitaxial growth. Accordingly, an interface epitaxial layer between low-concentration impurity layer 603a and body region 103 may be formed.

Next, a valve of the third impurity gas passage is closed. By using the second impurity gas passage for forming the medium-concentration impurity layer, the impurity gas is supplied at a flow rate larger than the flow rate during formation of the low-concentration impurity layer. Accordingly, medium-concentration impurity layer 602a is formed. After that, a valve of the second impurity gas passage is closed. By using the first impurity gas passage for forming the high-concentration impurity layer, the impurity gas is supplied at a flow rate larger than the flow rate during formation of the medium-concentration impurity layer. Accordingly, high-concentration impurity layer 601 is formed. Subsequently, a valve of the first impurity gas passage is closed. By using again the second impurity gas passage for forming the medium-concentration impurity layer, medium-concentration impurity layer 602b is formed. Note that the flow rates of the source gases during formation of medium-concentration impurity layers 602a, 602b and high-concentration impurity layer 601 may be equal to the flow rate of the source gas during formation of low-concentration impurity layer 603a. Thus, channel layer 106 can be formed.

When the flow rates of the impurity gases are controlled by switching the gas passages, an impurity concentration in a thickness direction can be changed more sharply at an interface between two adjacent impurity layers than when flow rates of impurity gases are controlled by using an identical gas passage. For example, since a thickness of a region where an impurity concentration gradually changes can be more sufficiently reduced than a thickness of each impurity layer, a substantially flat region can be formed in an impurity concentration profile of each of the impurity layers. As a result, the impurity concentration in and the thickness of each of the layers of channel layer 106 can be controlled with high precision. Therefore, while desired threshold voltage Vth and channel resistance are secured, variations in characteristic in a wafer plane can be reduced more effectively.

In order to change the impurity concentration more sharply at each interface of the plurality of layers in channel layer 106, epitaxial growth may be performed at a comparatively low growth rate. For example, the growth rate may be set ranging from 0.5 μm/h to 5.0 μm/h inclusive.

Note that a plurality of layers having different impurity concentrations may be formed by changing a flow rate of an impurity gas, using one gas passage installed in a chamber. According to this method, the flow rate of the impurity gas changes more gradually than when the gas passages are switched. Accordingly, a change in impurity concentration within an epitaxial film is gentler.

Figure 8D:
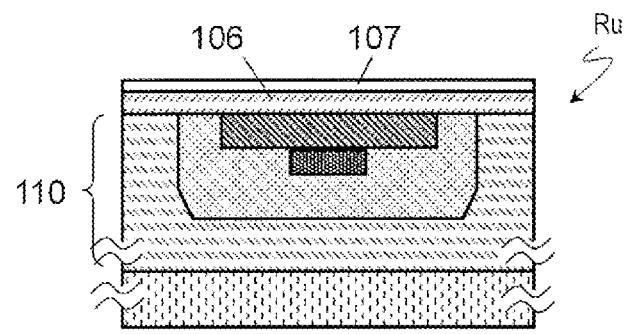
FIG. 8D is a sectional view of the process used to illustrate the method for manufacturing the silicon carbide semiconductor element.

Next, as illustrated in FIG. 8D, for example, the surface of channel layer 106 is thermally oxidized to form gate insulating film 107 on the surface of channel layer 106. Gate insulating film 107 may be an oxide film, an oxynitride film, or a film multilayered with the oxide film and the oxynitride film. Here, as gate insulating film 107, for example, the surface of channel layer 106 is thermally oxidized under a temperature ranging from 1100° C. to 1400° C. to form a thermal oxide ($SiO_2$) film. Gate insulating film 107 has a thickness ranging from 40 nm to 80 nm inclusive, for example. Instead of the thermal oxide film, a $SiO_2$ film may be formed through the CVD method on channel layer 106.

Due to the thermal oxidation of channel layer 106, surface of medium-concentration impurity layer 602b as the top layer of channel layer 106 is oxidized (sacrificially oxidized) and lost. Therefore, a thickness of medium-concentration impurity layer 602b is reduced more than when medium-concentration impurity layer 602b is deposited.

Figure 8E:
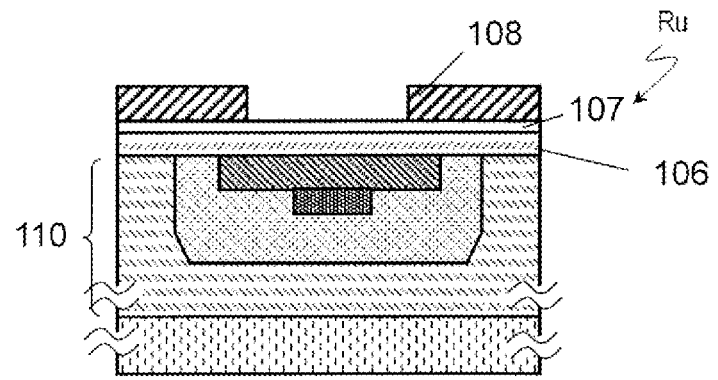
FIG. 8E is a sectional view of the process used to illustrate the method for manufacturing the silicon carbide semiconductor element.

Next, as illustrated in FIG. 8E, gate electrode 108 is formed on gate insulating film 107. Gate electrode 108 can be formed by using a low pressure chemical vapor deposition (LPCVD) apparatus to allow polysilicon (poly-Si film) doped with phosphorus to be deposited on gate insulating film 107, for example.

Figure 8F:
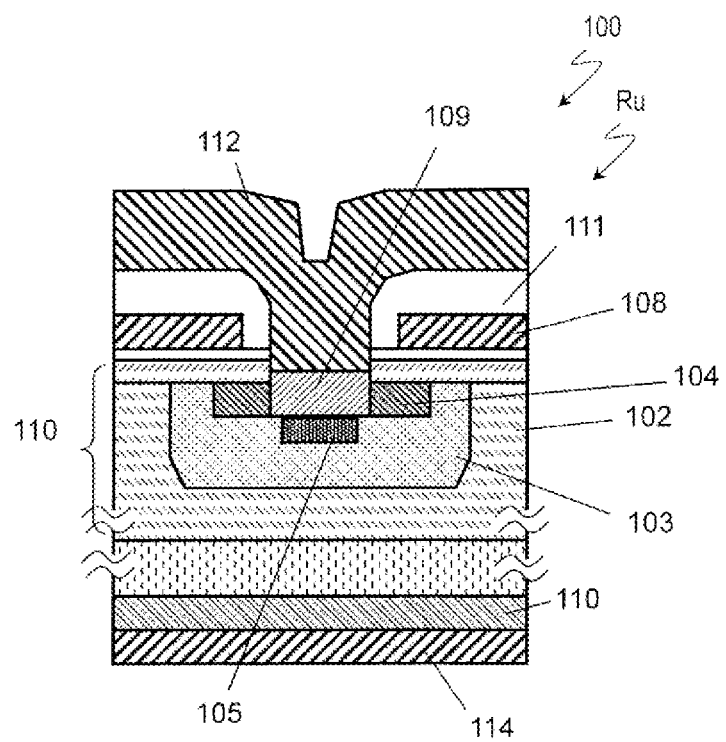
FIG. 8F is a sectional view of the process used to illustrate the method for manufacturing the silicon carbide semiconductor element.

Next, as illustrated in FIG. 8F, source electrode 109 and drain electrode 114 are formed.

Interlayer insulating layer 111 is first allowed to deposit through the CVD method so as to cover gate electrode 108, for example. Interlayer insulating layer 111 may be made of $SiO_2$. After that, a source electrode opening is formed on interlayer insulating layer 111. Next, source electrode 109 is formed in the opening of interlayer insulating layer 111. Herein, for example, a nickel film having a thickness ranging from approximately 50 nm to approximately 100 nm is first formed in the opening, and then heat treatment is performed under an inert atmosphere for five minutes at a temperature of 950° C. to allow nickel to react with a silicon carbide surface. Source electrode 109 made of nickel silicide is therefore formed. Source electrode 109 forms an ohmic contact with a part of source region 104 and contact region 105. Drain electrode 114 is formed on a back surface of substrate 101. For example, titanium having a thickness of approximately 150 nm is deposited on the back surface of substrate 101 and similar heat treatment is performed to cause titanium to react with the silicon carbide surface. Drain electrode 114 made of titanium silicide is therefore formed. Drain electrode 114 forms an ohmic contact with substrate 101. After that, on interlayer insulating layer 111 and in the opening of interlayer insulating layer 111, source wire 112 is formed so as to abut on source electrode 109 in the opening.

With the above described process, element structures including the plurality of unit cells 100 are formed in element regions of the silicon carbide epitaxial wafer. Although not shown in the drawings, after that, silicon carbide epitaxial wafer 300 is cut into elements (chips). A plurality of silicon carbide semiconductor elements (MISFETs) 200 can be therefore obtained.

EXAMPLES AND COMPARATIVE EXAMPLES

Production of MISFETs as Samples 1 to 4

MISFETs as Samples 1 to 4 were produced by varying impurity concentration Cn in a part of an impurity layer constituting a channel layer.

Figure 9:
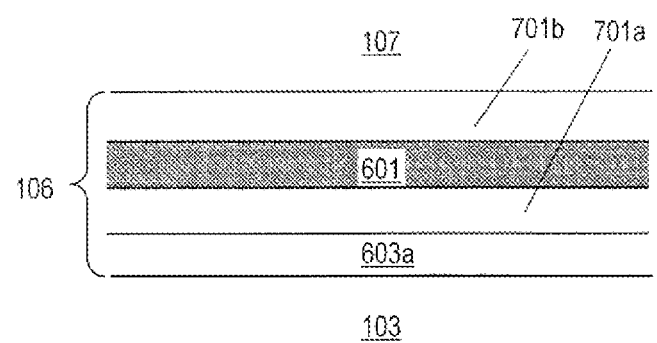
FIG. 9 is a sectional view of a channel layer in each of MISFETs as Samples 1 to 4.

Each of the MISFETs produced as Samples 1 to 4 has a configuration similar to the configuration described with reference to FIG. 1. As illustrated in FIG. 9, channel layer 106 of each of these MISFETs has a multilayer structure including low-concentration impurity layer 603a, first impurity layer 701a, high-concentration impurity layer 601, and second impurity layer 701b in this order from body region 103 side. Channel layers 106 of the MISFETs as Samples 1 to 4 have a similar configuration except that impurity concentrations (nitrogen concentrations) Cn in first impurity layer 701a and second impurity layer 701b are different.

Herein, according to the method described with reference to FIG. 8C, a source gas and an impurity gas were supplied to allow silicon carbide to epitaxially grow, thereby forming channel layer 106. A growth temperature of channel layer 106 was specified to 1500° C., a growth pressure was specified to 200 hPa, and a supply ratio of a source gas (C/Si ratio) was specified to 1.2. Flow rates of the source gas during formation of the impurity layers were made constant, and flow rates of the impurity gas (nitrogen gas) were made different by switching impurity gas passages.

Table 1 shows a thickness, an impurity concentration, and a flow rate of the nitrogen gas during epitaxial growth of each of the impurity layers in channel layers 106 of the MISFETs as Samples 1 to 4.

TABLE 1

|  |  | Sample 1 | Sample 2 | Sample 3 | Sample 4 |
|---|---|---|---|---|---|
| Low-concentration impurity layer 603a | Nitrogen gas flow rate (sccm) | 0 | | | |
| | Impurity concentration ($cm^{-3}$) | $1 \times 10^{16}$ | | | |
| | Thickness (nm) | 5 | | | |
| First impurity layer 701a | Nitrogen gas flow rate (sccm) | 0 | 1 | 4 | 17 |
| | Impurity concentration ($cm^{-3}$) | $1 \times 10^{16}$ | $5 \times 10^{16}$ | $1 \times 10^{17}$ | $4 \times 10^{17}$ |
| | Thickness (nm) | 12 | 12 | 12 | 12 |
| High-concentration impurity layer 601 | Nitrogen gas flow rate (sccm) | 67 | | | |
| | Impurity concentration ($cm^{-3}$) | $1.4 \times 10^{18}$ | | | |
| | Thickness (nm) | 20 | | | |
| Second impurity layer 701b | Nitrogen gas flow rate (sccm) | 0 | 1 | 4 | 17 |
| | Impurity concentration ($cm^{-3}$) | $1 \times 10^{16}$ | $5 \times 10^{16}$ | $1 \times 10^{17}$ | $4 \times 10^{17}$ |
| | Thickness (nm) | 15 | 15 | 15 | 15 |

In Sample 1, first impurity layer 701a and second impurity layer 701b are low-concentration impurity layers, and have impurity concentrations identical to an impurity concentration of low-concentration impurity layer 603a. In Sample 2, first impurity layer 701a and second impurity layer 701b are low-concentration impurity layers, and have impurity concentrations higher than an impurity concentration of low-concentration impurity layer 603a. In Sample 3 and Sample 4, first impurity layer 701a and second impurity layer 701b are medium-concentration impurity layers in impurity concentrations of more than or equal to $1 \times 10^{17}/cm^{-3}$. Therefore, Samples 1, 2 are comparative examples, and Samples 3, 4 are examples.

Evaluation of MISFETs as Samples 1 to 4

Next, threshold voltage Vth, on-resistance Ron, and rising voltage Vf50 of a channel diode in each of the MISFETs as Samples 1 to 4 were measured to compare element characteristics and in-plane variations in element characteristics. In a case where each of the MISFETs as the Samples functions as a channel diode, rising voltage Vf50 is a drain voltage (reverse voltage) capable of flowing a current of 50 A to the channel diode when gate voltage Vg=−5V is applied.

Threshold voltages Vth in each of the MISFETs, as Samples 1 to 4, formed by using the same sized wafer were measured to obtain median value Vth-med of threshold voltages Vth. As an index of an in-plane variation in threshold voltage Vth, Vth-Range/2 which is a value of ½ of difference Vth-Range between a maximum value and a minimum value of threshold voltages Vth was calculated. Further, in each of the plurality of MISFETs, on-resistances Ron when on-state current Ion is 50 A and 100 A were measured to obtain median values Ron_50 A-med and Ron_100 A-med of on-resistances Ron, respectively. Furthermore, in each of the MISFETs, on-resistance Ron_50 A and Ron_100 A (Vth=4 V) when threshold voltage Vth is 4 V were obtained.

Further, in each of the plurality of MISFETs as Samples 1 to 4, rising voltages Vf50 were measured to obtain median value Vf50-med of rising voltages Vf50, difference Vf50-Range between a maximum value and a minimum value of rising voltages Vf50, and rising voltage Vf50 (Vth=4 V) when the threshold voltage is 4 V. Table 2 shows results of the evaluation.

TABLE 2

| | | Sample 1 | Sample 2 | Sample 3 | Sample 4 |
|---|---|---|---|---|---|
| Threshold voltage Vth [V] | Vth-med | 4.3 | 4.2 | 4.1 | 3.4 |
| | Vth-Range | 1.0 | 1.2 | 1.1 | 1.2 |
| | Vth-Range/2 | 0.5 | 0.6 | 0.5 | 0.6 |
| On-resistance Ron [mΩ] | Ron_50A-med | 14.5 | 14.0 | 13.4 | 11.6 |
| | Ron_100A-med | 17.6 | 16.6 | 15.6 | 12.3 |
| | Ron_50A (Vth = 4 V) | 13.0 | 12.9 | 12.9 | 12.4 |
| | Ron_100A (Vth = 4 V) | 15.4 | 15.1 | 14.8 | 14.0 |
| Rising voltage Vf50 [V] | Vf50-med | 2.59 | 2.56 | 2.56 | 2.42 |
| | Vf50 (Vth = 4 V) | 2.55 | 2.54 | 2.52 | 2.50 |
| | Vf50-Range | 0.11 | 0.13 | 0.13 | 0.16 |

Figure 10:
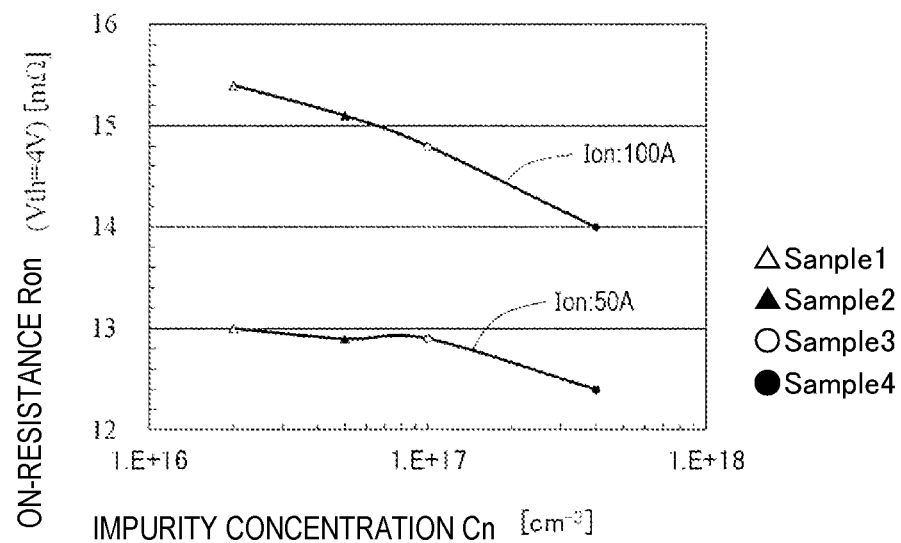
FIG. 10 is a graph illustrating a relationship between impurity concentration Cn and on-resistance Ron (Vth=4V), in each of the MISFETs as Samples 1 to 4.

FIG. 10 is a graph illustrating a relationship between impurity concentrations Cn in first impurity layer 701a and second impurity layer 701b and on-resistance Ron (Vth=4V). FIG. 10 includes "E" representing a power of 10. For example, "1E+17" represents $1 \times 10^{17}$. Further, a scale on a vertical axis in FIG. 10 functions as a logarithmic scale.

In FIG. 10, it is confirmed that the on-resistance can be reduced by increasing impurity concentrations Cn in first impurity layer 701a and second impurity layer 701b. The on-resistance and channel resistance of the MISFET as Sample 4 are reduced by about 5% and about 10%, respectively, with respect to the on-resistance of the MISFET as Sample 1, when on-state current Ion is 50 A. Further, the on-resistance and channel resistance are reduced by about 10% and about 20%, respectively, when on-state current Ion is 100 A. Therefore, when the on-state current becomes large, an effect of reducing the on-resistance is more conspicuous.

Figure 11:
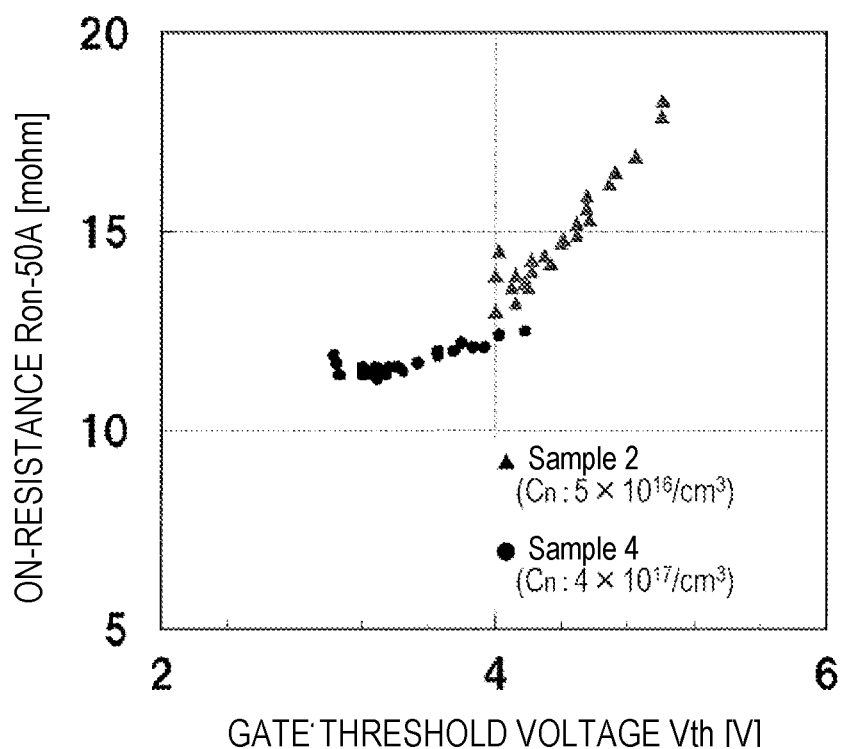
FIG. 11 is a graph illustrating a relationship between threshold voltage Vth and on-resistance Ron_50 A when an on-state current is 50 A, in each of the MISFETs as Samples 2 and 4.

FIG. 11 is a graph illustrating a relationship between threshold voltage Vth and on-resistance Ron_50 A when the on-state current is 50 A, in each of the MISFETs as Samples 2 and 4. In FIG. 11, it is also found that provision of the medium-concentration impurity layer having the impurity concentration of more than or equal to $1 \times 10^{17}/cm^3$ as first impurity layer 701a and second impurity layer 701b can reduce on-resistance Ron. Threshold voltage Vth in the MISFET as Sample 4 is lower than threshold voltage Vth in the MISFET as Sample 1. However, threshold voltage Vth in the MISFET as Sample 4 can be raised to almost the same level as threshold voltage Vth in the MISFET as Sample 1 by thinning the low-concentration impurity layer or the medium-concentration impurity layer in the MISFET as Sample 4 by several nm, for example.

Figure 12A:
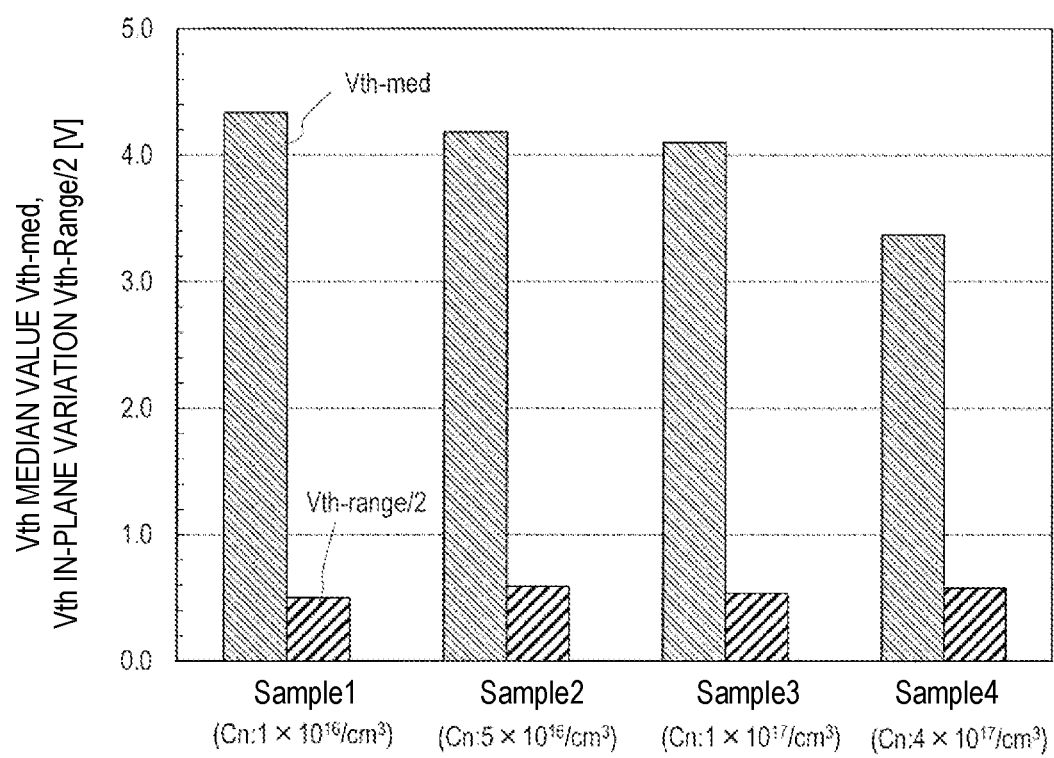
FIG. 12A is a graph illustrating median value Vth-med of threshold voltage Vth and in-plane variation Vth-Range/2 in the threshold voltage, in each of the MISFETs as Samples 1 to 4.

FIG. 12A is a graph illustrating median value Vth-med of threshold voltage Vth and in-plane variation Vth-Range/2 in the threshold voltage, in each of the MISFETs as Samples 1 to 4. Further, FIG. 12B is an enlarged graph to compare in-plane variations Vth-Range/2 in the threshold voltages in FIG. 12A.

Figure 12B:
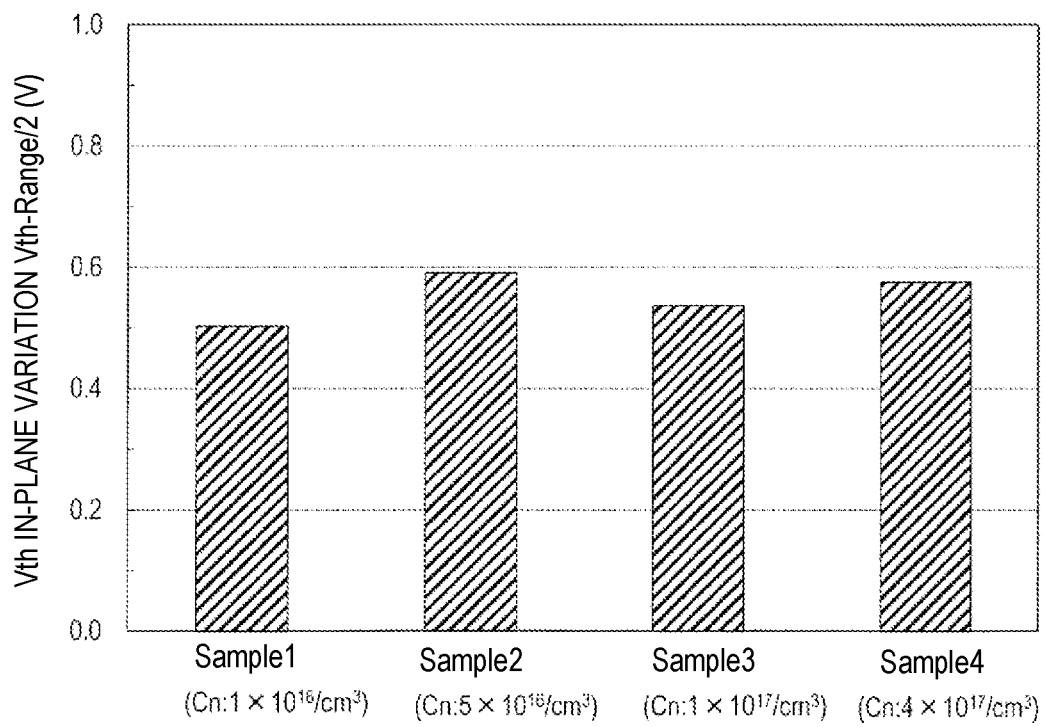
FIG. 12B is a graph illustrating in-plane variation Vth-Range/2 in the threshold voltage, in each of the MISFETs as Samples 1 to 4.

From the results shown in FIGS. 12A and 12B, it is confirmed that the variation in threshold voltage Vth within the wafer surface is hardly increased even when impurity concentrations Cn in first impurity layer 701a and second impurity layer 701b are increased more than or equal to $1 \times 10^{17}/cm^3$.

Figure 13:
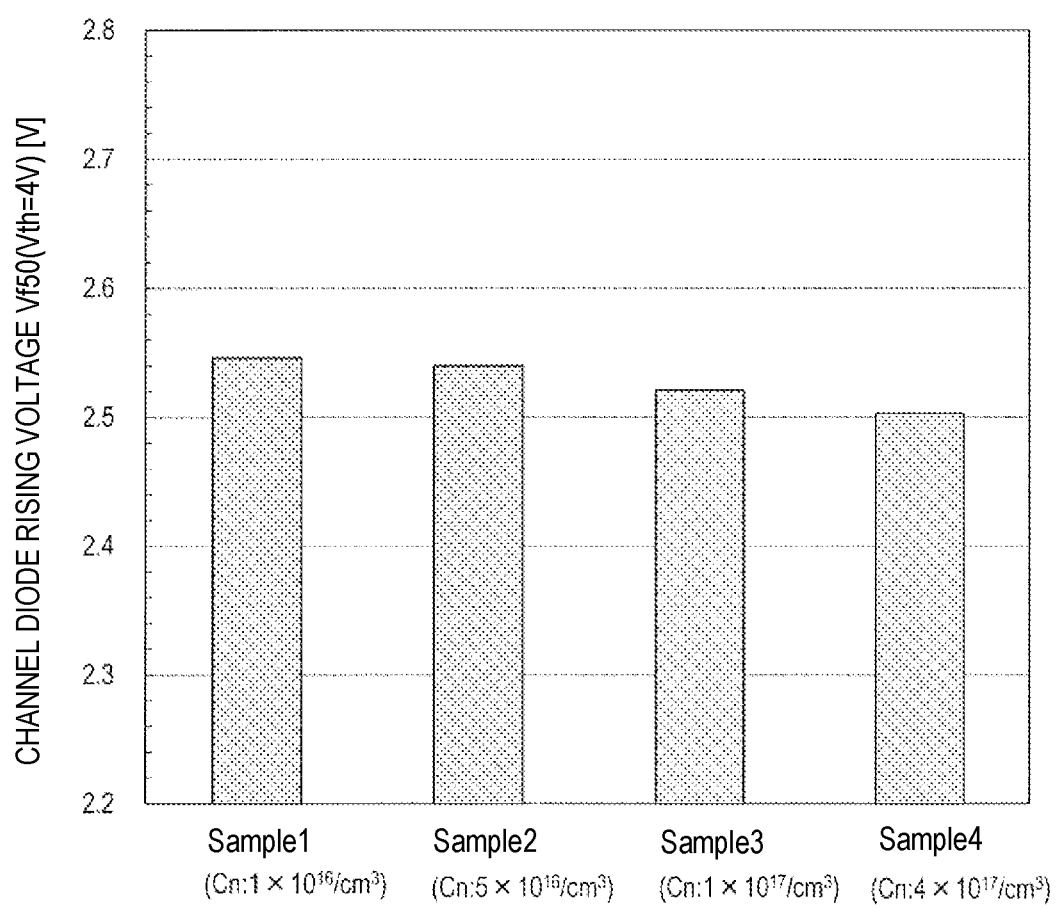
FIG. 13 is a graph illustrating rising voltage Vf50 (Vth=4 V) of a channel diode, in each of the MISFETs as Samples 1 to 4.

FIG. 13 is a graph illustrating rising voltage Vf50 of a channel diode when threshold voltage Vth is 4 V, in each of the MISFETs as Samples 1 to 4.

In FIG. 13, it is found that rising voltage Vf50 can be lowered and a characteristic in channel diode can be improved by increasing impurity concentrations Cn in first impurity layer 701a and second impurity layer 701b more than or equal to $1 \times 10^{17}/cm^3$.

As can be seen from these results, arrangement of the medium-concentration impurity layer higher in impurity concentration than low-concentration impurity layer 603a in channel layer 106 can reduce on-resistance, while suppressing the variation in threshold voltage Vth within the wafer surface. Further, when the MISFET functions as a channel diode, a characteristic of the channel diode can be enhanced.

A silicon carbide semiconductor element according to the present exemplary embodiment is not limited to a planar-structured vertical MISFET, but may be a trench-structured vertical MISFET. A silicon carbide semiconductor element may otherwise be a horizontal MISFET in which a source electrode and a drain electrode are disposed on a main surface of a silicon carbide wafer. A silicon carbide semiconductor element may otherwise be a junction field effect transistor (JFET), for example. A silicon carbide wafer having a conductivity type that differs from a conductivity type of silicon carbide epitaxial layer 110 may be used to produce an insulated gate bipolar transistor (IGBT).

In addition to silicon carbide, a semiconductor epitaxial wafer and a semiconductor element made of another wide bandgap semiconductor, such as gallium nitride (GaN), gallium oxide ($Ga_2O_3$), and diamond, are also applicable. A semiconductor epitaxial wafer and a semiconductor element made of silicon are also applicable.

The technology disclosed in the present specification is useful for, for example, use of a semiconductor device used for a power converter. Especially, it is useful for use of a power semiconductor device to be installed on an on-vehicle power converter, a power converter for industrial equipment, or the like.

What is claimed is:

1. A silicon carbide semiconductor element comprising a plurality of unit cells, each of the plurality of unit cells includes
   a substrate having a first main surface and a second main surface,
   a silicon carbide semiconductor layer of a first conductivity type disposed on the first main surface of the substrate,
   a body region of a second conductivity type that is in contact with a surface of the silicon carbide semiconductor layer,
   a source region of the first conductivity type that is in contact with the body region, a channel layer comprising a silicon carbide semiconductor, the channel layer being disposed above the silicon carbide semiconductor layer so as to be in contact with at least a part of the body region, a gate insulating film disposed above the channel layer, and a gate electrode disposed above the gate insulating film, wherein the channel layer has a multilayer structure, the multilayer structure including a higher-concentration impurity layer containing impurities of the first conductivity type in a concentration ranging from $1\times10^{18}/cm^3$ to $1\times10^{19}/cm^3$ inclusive, a first medium-concentration impurity layer containing impurities of the first conductivity type in a concentration ranging from more than or equal to $1\times10^{17}/cm^3$ to less than $1\times10^{18}/cm^3$, and a first lower-concentration impurity layer containing impurities of the first conductivity type in a concentration of less than $1\times10^{17}/cm^3$, and the first lower-concentration impurity layer is disposed closer to the body region than the higher-concentration impurity layer and the first medium-concentration impurity layer are.

2. The silicon carbide semiconductor element according to claim 1, wherein the first medium-concentration impurity layer has a thickness ranging from 5 nm to 30 nm inclusive.

3. The silicon carbide semiconductor element according to claim 1, wherein the higher-concentration impurity layer has a thickness ranging from 10 nm to 40 nm inclusive.

4. The silicon carbide semiconductor element according to claim 1, wherein the first lower-concentration impurity layer has a thickness ranging from 1 nm to 20 nm inclusive.

5. The silicon carbide semiconductor element according to claim 1, wherein an interface epitaxial layer higher in impurity concentration than the first lower-concentration impurity layer is disposed at an interface between the channel layer and the body region, and the first lower-concentration impurity layer is disposed on the interface epitaxial layer so as to be in contact with the interface epitaxial layer.

6. The silicon carbide semiconductor element according to claim 1, wherein the first medium-concentration impurity layer is disposed between the first lower-concentration impurity layer and the higher-concentration impurity layer.

7. The silicon carbide semiconductor element according to claim 6, wherein the channel layer further includes a second medium-concentration impurity layer containing impurities of the first conductivity type in a concentration ranging from more than or equal to $1\times10^{17}/cm^3$ to less than $1\times10^{18}/cm^3$, and the higher-concentration impurity layer is disposed between the first medium-concentration impurity layer and the second medium-concentration impurity layer and is in contact with the first medium-concentration impurity layer and the second medium-concentration impurity layer.

8. The silicon carbide semiconductor element according to claim 1, wherein the channel layer further includes a second lower-concentration impurity layer containing impurities of the first conductivity type in a concentration of less than $1\times10^{17}/cm^3$, and the higher-concentration impurity layer and the first medium-concentration impurity layer are disposed between the first lower-concentration impurity layer and the second lower-concentration impurity layer.

9. The silicon carbide semiconductor element according to claim 1, wherein the higher-concentration impurity layer is disposed between the first lower-concentration impurity layer and the second medium-concentration impurity layer.

10. The silicon carbide semiconductor element according to claim 1, wherein in each of the higher-concentration impurity layer, the first medium-concentration impurity layer, and the first lower-concentration impurity layer, a concentration profile of impurities of the first conductivity type in a direction that each layer of the multilayer structure of the channel layer is disposed above the substrate includes a substantially flat region.

11. The silicon carbide semiconductor element according to claim 1, wherein each of the plurality of unit cells further includes a source electrode electrically connected to the source region and the body region, and a drain electrode disposed on the second main surface of the substrate, and in each of the plurality of unit cells, when Vds and Vgs respectively represent potentials applied to the drain electrode and the gate electrode relative to the source electrode, and Vth represents a gate threshold voltage, when Vgs≥Vth, a current flows from the drain electrode to the source electrode through the channel layer, and when Vgs<Vth, as Vds decreases to be smaller than 0 V, a current flows from the source electrode to the drain electrode through the channel layer before a current starts to flow from the body region to the silicon carbide semiconductor layer.

12. A silicon carbide semiconductor element comprising a plurality of unit cells, each of the plurality of unit cells includes:

a substrate having a first main surface and a second main surface, a silicon carbide semiconductor layer of a first conductivity type disposed on the first main surface of the substrate, a body region of a second conductivity type that is in contact with a surface of the silicon carbide semiconductor layer, a source region of the first conductivity type that is in contact with the body region, a channel layer comprising a silicon carbide semiconductor, the channel layer being disposed above the silicon carbide semiconductor layer so as to be in contact with at least a part of the body region, a gate insulating film disposed above the channel layer, and a gate electrode disposed above the gate insulating film, wherein the channel layer has a multilayer structure, the multilayer structure including a first medium-concentration impurity layer and a second medium-concentration impurity layer each containing impurities of the first conductivity type in a concentration ranging from more than or equal to $1\times10^{17}/cm^3$ to less than $1\times10^{18}/cm^3$, and a higher-concentration impurity layer containing impurities of the first conductivity type in a concentration ranging from $1\times10^{18}/cm^3$ to $1\times10^{19}/cm^3$ inclusive, and the higher-concentration impurity layer is disposed between the first medium-concentration impurity layer and the second medium-concentration impurity layer.

13. The silicon carbide semiconductor element according to claim 12, wherein the first medium-concentration impurity layer and the second medium-concentration impurity layer each have a thickness ranging from 5 nm to 30 nm inclusive.

14. The silicon carbide semiconductor element according to claim 12, wherein in each of the higher-concentration impurity layer, the first medium-concentration impurity layer, and the second medium-concentration impurity layer, a concentration profile of impurities of the first conductivity type in a direction that each layer of the multilayer structure of the channel layer is disposed above the substrate includes a substantially flat region.

\* \* \* \* \*